(12) United States Patent
Lee

(10) Patent No.: US 11,574,683 B2
(45) Date of Patent: Feb. 7, 2023

(54) NON-VOLATILE MEMORY DEVICE AND PROGRAMMING METHOD THEREOF

(71) Applicant: Samsung Electronics Co., Ltd., Suwon-si (KR)

(72) Inventor: Ji-Sang Lee, Iksan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/402,955

(22) Filed: Aug. 16, 2021

(65) Prior Publication Data

US 2021/0375366 A1 Dec. 2, 2021

Related U.S. Application Data

(63) Continuation of application No. 16/934,150, filed on Jul. 21, 2020, now Pat. No. 11,127,465, which is a continuation of application No. 16/415,274, filed on May 17, 2019, now Pat. No. 10,734,078, which is a
(Continued)

(30) Foreign Application Priority Data

Jan. 9, 2017 (KR) .................. 10-2017-0002922

(51) Int. Cl.
| | |
|---|---|
| G11C 16/04 | (2006.01) |
| G11C 16/10 | (2006.01) |
| G11C 16/08 | (2006.01) |
| G11C 16/24 | (2006.01) |
| G11C 16/26 | (2006.01) |
| G11C 16/32 | (2006.01) |
| G11C 16/34 | (2006.01) |
| G11C 7/22 | (2006.01) |
| G11C 29/04 | (2006.01) |

(52) U.S. Cl.
CPC .......... *G11C 16/10* (2013.01); *G11C 16/0483* (2013.01); *G11C 16/08* (2013.01); *G11C 16/24* (2013.01); *G11C 16/26* (2013.01); *G11C 16/32* (2013.01); *G11C 16/3459* (2013.01); *G11C 7/22* (2013.01); *G11C 2029/0411* (2013.01)

(58) Field of Classification Search
CPC ..... G11C 16/10; G11C 16/0483; G11C 16/08; G11C 16/24; G11C 16/26; G11C 16/32; G11C 16/3459; G11C 7/22; G11C 2029/0411
USPC .................................... 365/185.11
See application file for complete search history.

(56) References Cited

U.S. PATENT DOCUMENTS

| | | |
|---|---|---|
| 6,148,360 A | 11/2000 | Leak et al. |
| 6,930,925 B2 | 8/2005 | Guo et al. |
| 7,085,167 B2 | 8/2006 | Lee et al. |

(Continued)

*Primary Examiner* — Huan Hoang
(74) *Attorney, Agent, or Firm* — Harness, Dickey & Pierce, P.L.C.

(57) ABSTRACT

A non-volatile memory device includes: a memory cell array including a plurality of memory cells connected to a plurality of word lines and a plurality of bit lines, a row decoder configured to selectively control the plurality of word lines, a page buffer including a plurality of latches corresponding to the plurality of bit lines, respectively, and a control circuit configured to control the non-volatile memory device to enter a suspend state after terminating a verify operation of a program loop of a program operation of the plurality of memory cells in response to a suspend request being generated during an execution operation of the program loop.

20 Claims, 23 Drawing Sheets

Related U.S. Application Data continuation of application No. 15/661,386, filed on Jul. 27, 2017, now Pat. No. 10,325,658.

(56) References Cited

U.S. PATENT DOCUMENTS

| | | |
|---|---|---|
| 7,317,636 B2 | 1/2008 | Ide et al. |
| 7,593,266 B2 | 9/2009 | Senoo et al. |
| 8,274,838 B2 | 9/2012 | Dutta et al. |
| 8,705,286 B2 | 4/2014 | Li |
| 9,007,841 B1 | 4/2015 | Li et al. |
| 10,325,658 B2 | 6/2019 | Lee |
| 10,734,078 B2 | 8/2020 | Lee |
| 2015/0186042 A1 | 7/2015 | Lee |
| 2016/0012902 A1 | 1/2016 | Harada et al. |
| 2018/0151237 A1 | 5/2018 | Lee et al. |
| 2019/0080773 A1* | 3/2019 | Kondo .................. G11C 16/08 |

\* cited by examiner

NON-VOLATILE MEMORY DEVICE AND PROGRAMMING METHOD THEREOF

CROSS-REFERENCE TO RELATED APPLICATION

This application is a continuation of U.S. application Ser. No. 16/934,150, filed on Jul. 21, 2020, which is a continuation of U.S. application Ser. No. 16/415,274, filed on May 17, 2019, now granted as U.S. Pat. No. 10,734,078 on Aug. 4, 2020, which is a continuation of U.S. application Ser. No. 15/661,386, filed on Jul. 27, 2017, now granted as U.S. Pat. No. 10,325,658 on Jun. 18, 2019, which claims priority to the benefit of Korean Patent Application No. 10-2017-0002922 filed in the Korean Intellectual Property Office on Jan. 9, 2017, the entire contents of each of which are incorporated herein by reference.

BACKGROUND

This disclosure relates to a non-volatile memory device, and a programming method thereof.

A semiconductor memory device may generally be divided into a volatile memory device and a non-volatile memory device. The non-volatile memory device may maintain stored data without loss of data in response to power being stopped, and may be used as a data storage device or a memory for a system. A flash memory device among the non-volatile memory devices may be widely used as a data storage device replacing a hard disk.

When a read operation is desired to be performed during the program operation, the flash memory device may suspend a currently performed program operation, perform the required read operation, and then resume the suspended program operation. Accordingly, a time interval between the suspend state and the resume state of the program may lead to deterioration of a program threshold voltage distribution. Accordingly, a technology for preventing, or reducing the likelihood of, the program threshold voltage distribution from deteriorating during the program suspend-resume operation is desired.
Inventive Concepts

SUMMARY

Embodiments have been made in an effort to provide a non-volatile memory device, which is capable of preventing, or reducing the likelihood of, a program threshold voltage distribution from deteriorating due to a program suspend-resume operation, and a programming method thereof.

In one example embodiment of inventive concepts, provided is a non-volatile memory device including a memory cell array including a plurality of memory cells connected to a plurality of word lines and a plurality of bit lines, a row decoder configured to selectively control the plurality of word lines, a page buffer including a plurality of latches corresponding to the plurality of bit lines, respectively, and a control circuit configured to control the non-volatile memory device to enter a suspend state after terminating a verify operation of a program loop of a program operation of the plurality of memory cells in response to a suspend request being generated during an execution operation of the program loop.

In one example embodiment of inventive concepts, provided is a memory cell array including a plurality of memory cells connected to a plurality of word lines and a plurality of bit lines, a row decoder configured to selectively control the plurality of word lines, a page buffer including a plurality of latches corresponding to the plurality of bit lines, respectively, and a control circuit configured to control the non-volatile memory device to enter a suspend state after finishing an execution operation of an Nth program loop of a program operation entering the suspend state being in response to a suspend request being generated during the execution operation, the control circuit configured to control a verify operation of the Nth program loop to be performed in response to the program operation being resumed after entering the suspend state, and the control circuit configured to control a difference between a program voltage of the N+1th program loop and a program voltage of the N+2th program loop to be less than a difference between a program voltage of the Nth program loop and a program voltage of the N+1th program loop, where N is a natural number In one example embodiment of inventive concepts, provided is a method of programming a non-volatile memory device including a plurality of memory cells, the method comprising performing an Nth program loop of a program operation on a plurality of corresponding memory cells, receiving a suspend request, verifying the Nth program loop, and entering a suspend state, where N is a natural number.

In one example embodiment of inventive concepts, provided is a non-volatile memory device including a first block of memory cells and a second block of memory cells, the non-volatile memory device configured to enter a suspend state after terminating a verify operation of a program loop, the non-volatile memory device entering the suspend state in response to a suspend request being generated during an execution operation of a programming operation for the first block of memory cells, and a memory controller configured to control the non-volatile memory device.

According to example embodiments, providing the non-volatile memory device, which is capable of reducing the likelihood of a program threshold voltage distribution from deteriorating due to a program suspend-resume operation, and a programming method thereof, may be possible.

DETAILED DESCRIPTION OF THE EMBODIMENTS

Figure 1:
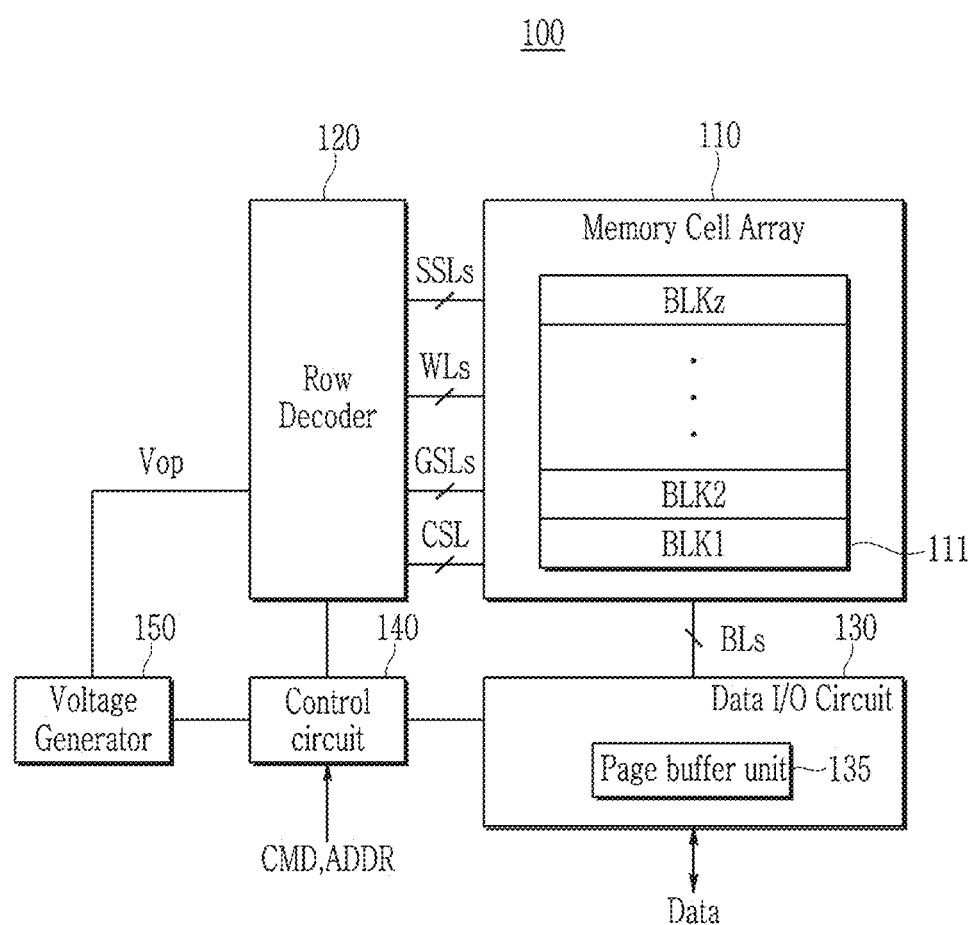
FIG. 1 is a diagram describing a non-volatile memory device.

In the following detailed description, only certain example embodiments of inventive concepts have been shown and described, simply by way of illustration. The described embodiments may be modified in various different ways, all without departing from the spirit or scope of inventive concepts. Accordingly, the drawings and description are to be regarded as illustrative in nature and not restrictive. Like reference numerals may designate like elements throughout the specification.

FIG. 1 is a diagram describing a non-volatile memory device.

Referring to FIG. 1, a non-volatile memory device 100 includes a memory cell array 110, a row decoder 120, a data input/output circuit (data I/O circuit) 130, a control circuit 140, and a voltage generator 150.

A memory cell array 110 may include a plurality of memory blocks BLK1 to BLKz. The memory blocks may be connected to the row decoder 120 through word lines WLs, string selection lines SSLs, ground selection lines GSLs, and a common source line. The memory cell array 110 may be connected to the data I/O circuit 130 through bit lines BLs. The memory cell array 110 may be a two dimensional memory cell array, in which the plurality of memory cells is two dimensionally formed on a substrate. Further, the memory cell array 110 may be a three dimensional memory cell array, in which the plurality of memory cells is stacked on a substrate in a vertical direction. Each of, or at least some of, the memory cells of the memory cell array 110 may be a single level cell SLC, in which 1 bit is stored in one cell. Alternatively or additionally, each of, or at least some of, the memory cells may be a multi-level cell MLC, in which 2 bits or more are stored in one cell.

The voltage generator 150 may generate operation voltages Vop to be provided to the row decoder 120 in response to a control of the control circuit 140. For example, during a program operation, the voltage generator 150 may generate a program voltage, a program pass voltage, a program verify voltage, and a program verify pass voltage in response to the control of the control circuit 140, and may provide the generated operation voltages to the row decoder 120. As another example, during a read operation, the voltage generator 150 may generate a read voltage and a read pass voltage in response to the control of the control circuit 140 and may provide the generated operation voltages to the row decoder 120. The row decoder 120 may selectively apply the received operation voltages to the word lines WLs under the control of the control circuit 140. Further, the voltage generator 150 may generate voltages applied to the string selection lines SSLs, the ground selection lines GSLs, and the common source line CSL during the program and read operations in response to the control of the control circuit 140, and may provide the generated voltages to the row decoder 120.

The row decoder 120 may select any one of the plurality of word lines WLs connected to the memory cell array in response to an address ADDR received from the outside or generated inside the non-volatile memory device 100. The row decoder 120 may receive an operation voltage Vop from the voltage generator 150, and may transmit the operation voltage Vop provided to the selected word line.

During the program operation, the row decoder 120 may select one word line, and may transmit the program voltage and the program verify voltage to the selected word line (selected WL). The row decoder 120 may transmit the program pass voltage to unselected word lines (unselected WLs) during the transmission of the program voltage to the selected word line. The row decoder 120 may transmit the program verify pass voltage to the unselected word lines during the transmission of the program verify voltage to the selected word line. During the read operation, the row decoder 120 may select one word line, and transmit the read voltage to the selected word line. The row decoder 120 may transmit the read pass voltage to the unselected word lines.

The data I/O circuit 130 may include a page buffer unit 135, and may receive data DATA from the outside and store the received data in the memory cell array 110 through the bit lines BLs. The data I/O circuit 130 may control the bit line voltage based on the data received from the outside and a threshold voltage of the memory cell during the program operation. The data I/O circuit 130 may receive the data DATA stored in the memory cell array 110 through the bit lines BLs, and may output the received data to the outside. FIG. 1 illustrates that the page buffer unit 135 is included in the data I/O circuit 130, but the page buffer unit 135 may be separately formed outside the data I/O circuit 130.

The control circuit 140 may receive a command CMD and an address ADDR form the outside, and may control general read, program, and erase operations of the non-volatile memory device 100. For example, the control circuit 140 may receive a program command from the outside and controls the general program operation of the non-volatile memory device 100. Alternatively or additionally, the control circuit 140 may receive a read command from the outside and controls the general read operation of the non-volatile memory device 100

Further, for example, when a read request is made to a second memory block BLK2 during the program operation of writing data in a first memory block BLK1 of the memory cell array 110, the control circuit 140 may suspend the program operation, which the non-volatile memory device 100 is performing on the first memory block BLK1. Further, the control circuit 140 may control the non-volatile memory device 100 to perform the requested read operation on the second memory block BLK2 after the program operation on the first memory blocks BLK1 is suspended. After the requested read operation is completed, the control circuit 140 may control the non-volatile memory device 100 to resume the suspended program operation for the first memory block BLK1.

As described above, the program operation during suspension and resumption of the non-volatile memory device may be performed under the control of the control circuit 140. Detailed contents will be described below with reference to FIGS. 12 to 21.

Each of, or at least some of, the memory blocks 111 may be independently connected to the plurality of word lines WLs, one or more string selection lines SSLs, and one or more ground selection lines GSLs. In FIG. 1, "111" denotes at least two memory blocks among the plurality of memory blocks. For example, the first memory block BLK1 may be connected to first word lines, a first string selection line, and a first ground selection line, and the second memory block BLK2 may be connected to second word lines, a second string selection line, and a second ground selection line.

When or if the first memory block is selected, a string selection voltage and a ground selection voltage may be applied to the first string selection line and the first ground selection line. When or if the second memory block is non-selected, a string non-selection voltage and a ground non-selection voltage may be applied to the second string selection line and the second ground selection line. The common source line CSL may be commonly connected to the plurality of memory blocks included in the memory cell array 110.

Figure 2:
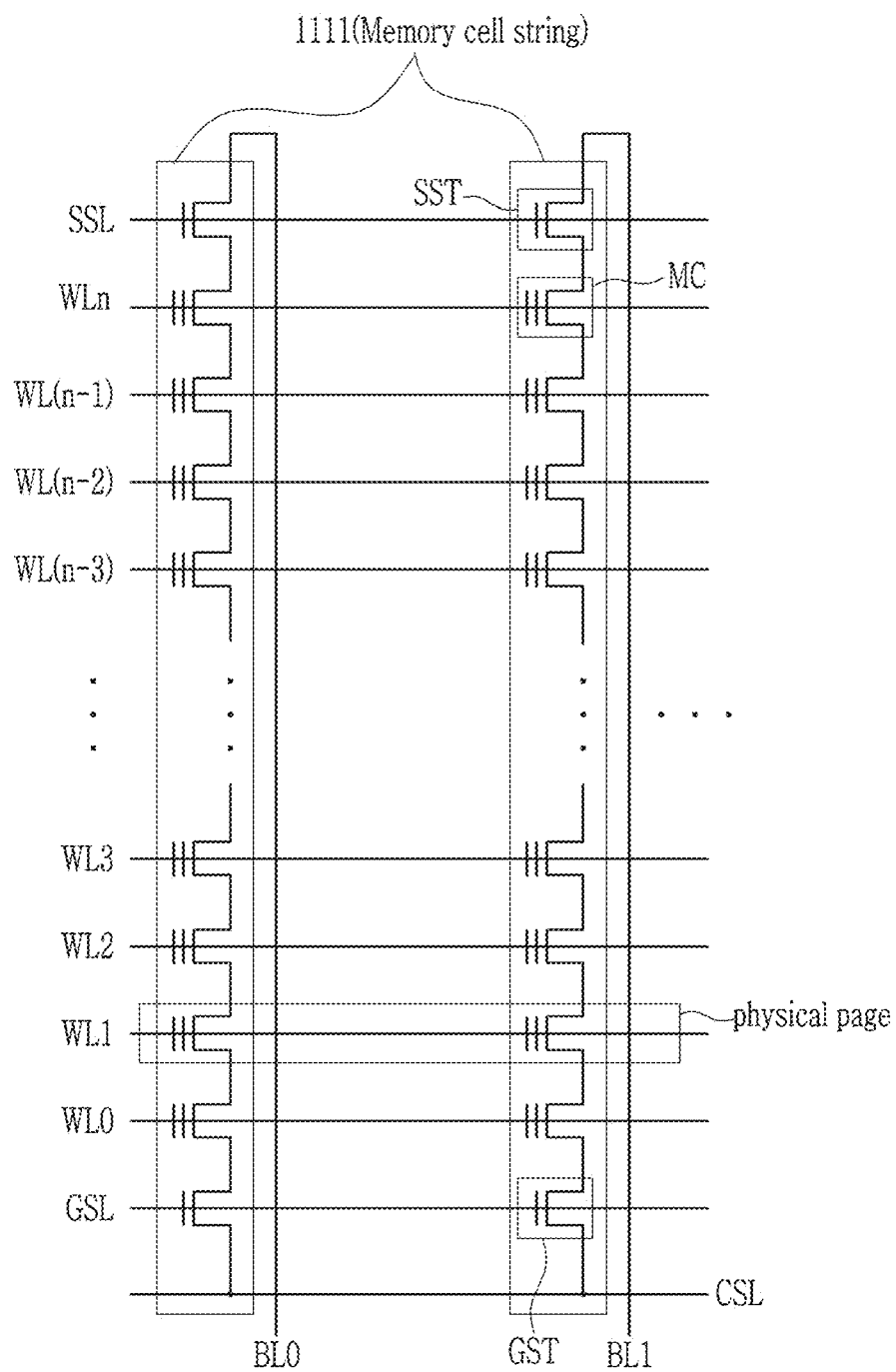
FIG. 2 is a diagram describing a memory block according to an example embodiment in detail.

FIG. 2 is a diagram describing the memory block according to the example embodiment in detail.

Referring to FIG. 2, each of, or at least some of, the memory blocks 1111 may include a plurality of memory cell strings 1111. Further, each of, or at least some of the plurality of memory cell strings 111 may include a plurality of serially connected memory cells MCs and may be connected to the corresponding bit line BL. Each of, or at least some of, the plurality of memory cell strings 1111 may include one string selection transistor SST between the plurality of serially connected memory cells MCs and the bit line BL. In FIG. 2, one string selection transistor SST is illustrated, but the memory cell string may include two or more serially connected string selection transistors SST between the plurality of serially connected memory cells MCs and the bit line BL.

The plurality of memory cell strings 1111 may include one ground select transistor GST between the plurality of serially connected memory cells MCs and the common source line CSL. In FIG. 2, one ground select transistor GST is illustrated, but the memory cell string may include two or more serially connected ground select transistors GSTs between the plurality of serially connected memory cells MCs and the common source line.

Some of the plurality of memory cells included in the memory blocks 111 may be commonly connected to one word line. Some or all of the memory cells commonly connected to one word line are simultaneously programmed, and the group of the simultaneously programmed memory cells is referred to as a physical page.

If the non-volatile memory 100 is configured to include a single level cell (SLC), one physical page may store one element of logical page data. If the non-volatile memory 100 is configured to include a multi-level cell (MLC), one physical page may store two or more elements of logical page data.

Figure 3:
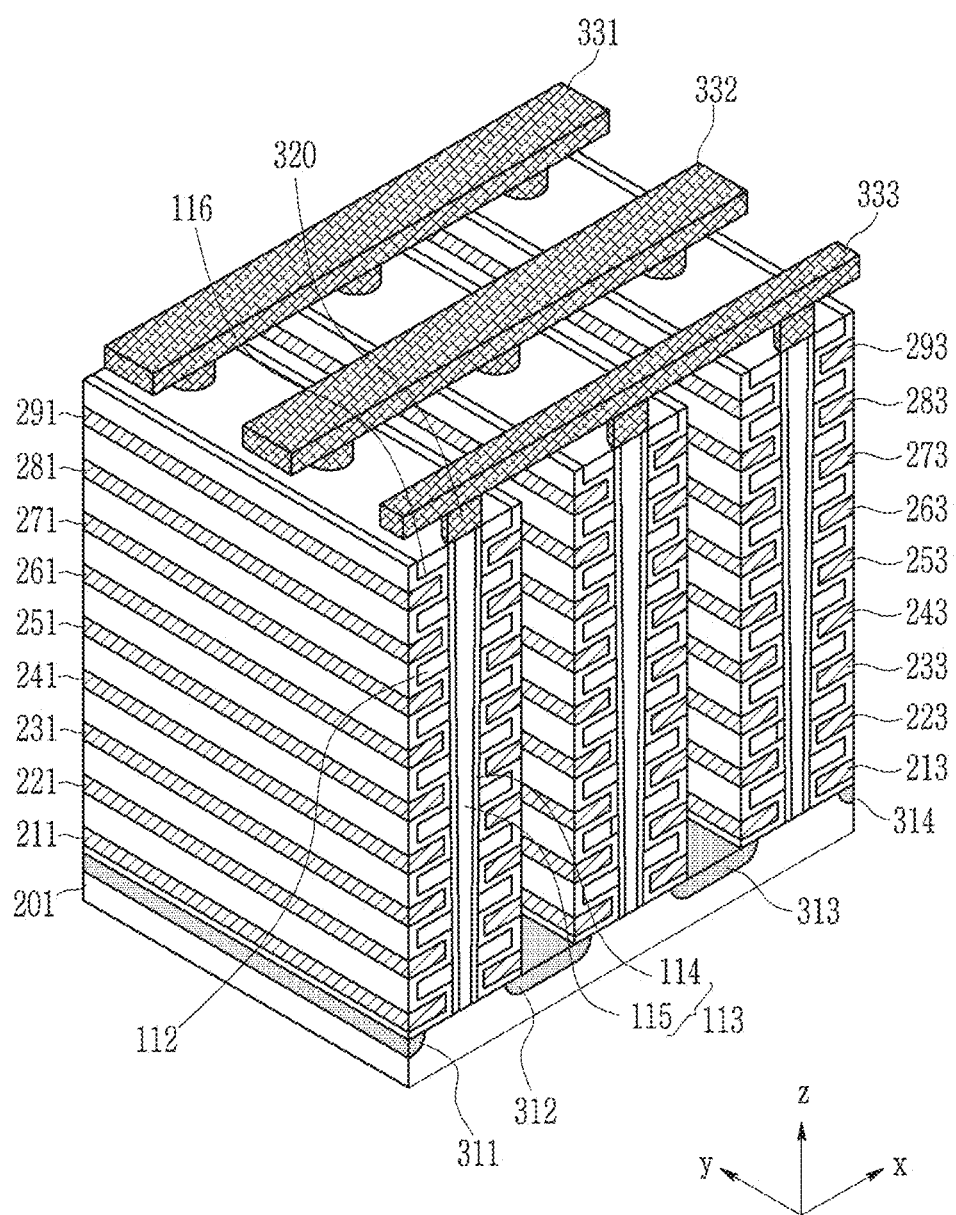
FIG. 3 is a diagram describing a memory block including a 3D memory cell array according to an example embodiment in detail.

FIG. 3 is a diagram describing the memory block including a 3D memory cell array according to an example embodiment in detail.

Referring to FIG. 3, each of the memory blocks 111 may include memory cell strings which are formed by vertically laminating, or stacking, memory cells on a substrate in a three dimensional (3D) structure. Each of the memory blocks 111 may include structures extending in a plurality of directions x, y, and z which are perpendicular to one another. In order to form the memory blocks 111, first, a substrate 201 is provided. For example, the substrate 201 may be formed of a P-well, which is formed by injecting or implanting a group V element, such as boron (B). Otherwise, the substrate 201 may be formed in a pocket P-well provided within an N-well. Hereinafter, it is assumed that the substrate 201 is a P-well. However, the substrate 201 is not limited to the P-well. The substrate 201 may be formed to be parallel to an xy plate (plane), and is vertical with respect to a z-axis direction.

A plurality of doping regions 311 to 314 may be formed on the substrate 201. For example, the plurality of doping regions 311 to 314 may be formed of an n-type conductor different from the substrate 201. Hereinafter, descriptions will be provided based on the case where the first to fourth doping regions 311 to 314 of the example embodiment have the n-type, but inventive concepts are not limited thereto.

A plurality of insulating materials 112 extending in the y-axis direction is sequentially provided in a z-axis direction on a region of the substrate 201 between the first and second doping regions 311 and 312. For example, the plurality of insulating materials 112 may be formed in the z-axis direction while being spaced apart from each other by a specific distance. For example, the insulating materials 112 may include an insulating material, such as a silicon oxide.

A pillar 113 passing through the insulating materials 112 may be formed on the substrate 201 between the first and second doping regions 311 and 312. For example, the pillar 113 may pass through the insulating material 112 and be connected with the substrate 201. Here, the pillar 113 may also be formed on the substrate between the second and third doping regions 312 and 313, and on the substrate between the third and fourth doping regions 313 and 314. The pillar 113 may form a channel during a read or program verify operation of the memory cell string.

A diameter of a channel hole may decrease closer to the substrate 201. Further, a diameter of the channel hole may increase far from the substrate and then decreased again from a specific position, like a pot shape. For example, the channel hole may also be formed so that a center portion of the channel hole is convex.

The pillar 113 may be formed of a plurality of materials. For example, a surface layer 114 of each pillar 113 may include a silicon material having a first type. For example, the surface layer 114 of the pillar 113 may include a silicon material having the same type as that of the substrate 201. Hereinafter, inventive concepts will be described on an assumption that the surface layer 114 of the pillar 113 includes p-type silicon. However, inventive concepts are not limited to the feature that the surface layer 114 of the pillar 113 includes p-type silicon.

An internal layer 115 of the pillar 113 may be formed of an insulating material. For example, the internal layer 115 of the pillar 113 may include an insulating material, such as a silicon oxide. Alternatively or additionally, the internal layer 115 of the pillar 113 may include an air gap.

An insulating layer 116 may be provided along the insulating materials 112, the pillars 113, and the exposed surface of the substrate 201 in the region between the first and second doping regions 311 and 312. For example, the insulating layer 116 provided onto an exposed surface of the last insulating material 112 in the z-axis direction, which is provided in the z-axis direction, may be removed. First conductive materials 211 to 291 may be provided onto an exposed surface of the insulating layer 116 in the region between the first and second doping regions 311 and 312. For example, the first conductive material 211 extending in the y-axis direction is provided between the insulating material 112 adjacent to the substrate 201 and the substrate 201. For example, the first conductive material 211 extending in the y-axis direction is provided between the insulating layer 116 on a lower surface of the insulating material 112 adjacent to the substrate 201 and the substrate 201.

The first conductive material extending in the y-axis direction may be provided between the insulating materials 112. For example, the first conductive materials 221 to 281 extending in the y-axis direction are provided between the insulating layer 116 on an upper surface of the insulating material 112 located at a lower end among the adjacent two insulating materials 112 and the insulating layer 116 on a lower surface of the insulating material 112 located at an upper end. The first conductive materials 211 to 291 may be or may include a metal material, and/or a conductive material, such as polysilicon or doped polysilicon.

The same structure as the structure on the first and second doping regions 311 and 312 may be provided in the regions between the second and third doping regions 312 and 313 and the third and fourth regions 313 and 314.

Drains 320 may be provided on the plurality of pillars 113, respectively. Second conductive materials 331 to 333 extending in the x-axis direction are provided on the drains 320. The second conductive materials 331 to 333 may be positioned, for example sequentially positioned, in the y-axis direction. The second conductive materials 331 to 333 may be connected to the drains 320 in corresponding regions, respectively. For example, the drains 320 and the second conductive material 333 extending in the x-axis direction may be connected through contact plugs, respectively. For example, the second conductive materials 331 to 333 may be or may include a metal material, and/or a conductive material, such as polysilicon or doped polysilicon.

Figure 4:
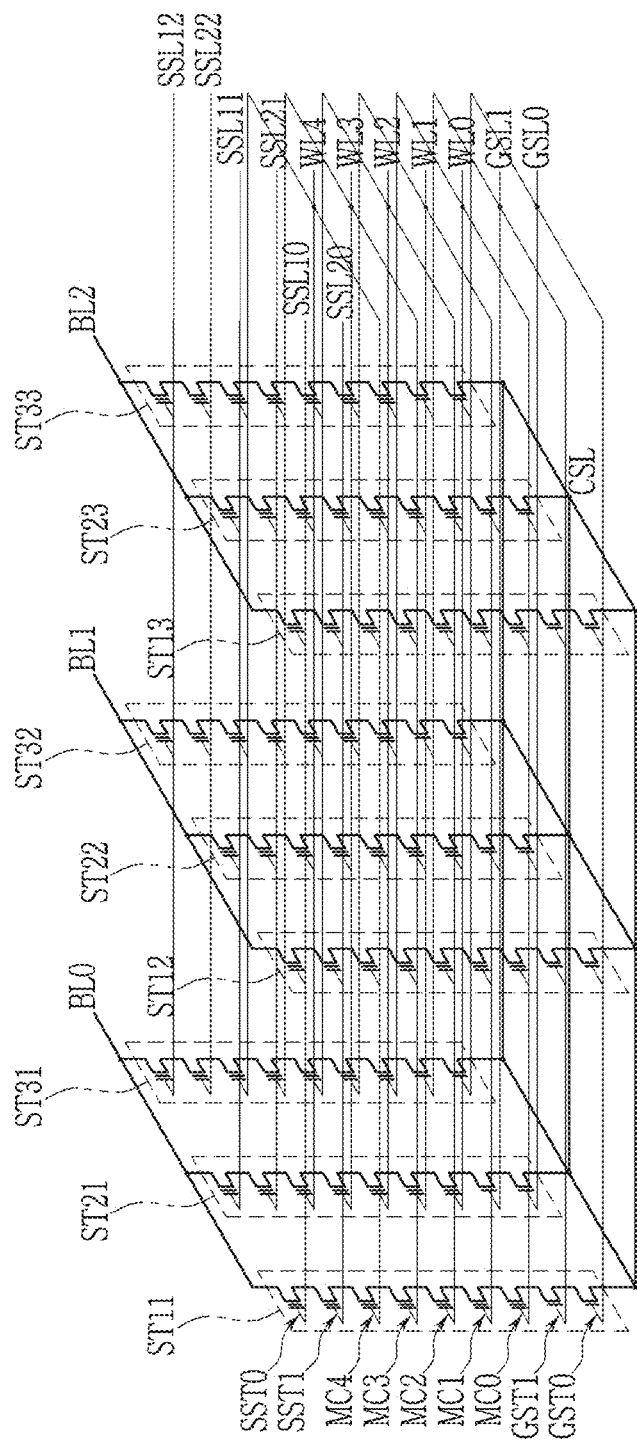
FIG. 4 is a circuit diagram of a memory block including a 3D memory cell array according to an example embodiment.

FIG. 4 is a circuit diagram of the memory block including the 3D memory cell array according to an example embodiment.

FIG. 4 is a circuit diagram illustrating an equivalent circuit of the memory block including the 3D structure described with reference to FIG. 3. Memory cell strings ST11, ST21, and ST31 may be connected between a bit line 0 BL0 and the common source line CSL. The bit line 0 BL0 may correspond to the second conductive material 331 extending in the x-axis direction. Memory cell strings ST12, ST22, and ST32 are connected between a bit line 1 BL1 and the common source line CSL. The bit line 1 BL1 corresponds to the second conductive material 332 extending in the x-axis direction. Memory cell strings ST13, ST23, and ST33 may be connected between a bit line 2 BL2 and the common source line CSL. The bit line 2 BL2 may correspond to the second conductive material 333 extending in the x-axis direction.

Each of, or at least some of, the plurality of memory cell strings ST11 to ST31, ST12 to ST32, and ST13 to ST33 may include the plurality of serially connected memory cells MC0 "GST" to MC4. Hereinafter, when at least one of the memory cell strings ST11 to ST31, ST12 to ST32, and ST13 to ST33 is referred, the one is denoted as "ST". The plurality of memory cells MC0 to MC4 may be stacked on the substrate 201 in the vertical direction. Each of, or at least some of, the memory cells MC0 to MC4 may be implemented with a charge trap flash memory cell (CTF) having a charge trap layer. Alternatively or additionally, each of, or at least some of, the memory cells MC0 to MC4 may also be implemented with a floating gate memory cell having a floating gate.

The memory cell string ST may include one or more string selection transistors connected between the plurality of serially connected memory cells MC0 to MC4 and the corresponding bit line BL. The memory cell string ST may include two serially connected string selection transistors SST0 and SST1 as illustrated in FIG. 4. Hereinafter, when at least one of SST0 and SST1 is referred, the one is denoted with "SST". The string selection transistor SST may be implemented with a memory cell having the same form as that of the memory cell MC.

The memory cell string ST may include one or more ground select transistors connected between the plurality of serially connected memory cells MC0 to MC4 and the common source line CSL. Each of the memory cell strings STs may include two serially connected ground select transistors GST0 and GST1 as illustrated in FIG. 4. Hereinafter, when at least one of GST0 and GST1 is referred, the one may be denoted with "GST". The ground selection transistor GST may also be implemented with a memory cell having the same form as that of the memory cell MC, or may also be implemented in a form of a general MOS transistor having no charge trap layer or floating gate.

The plurality of memory cell strings ST may be defined by dividing the plurality of memory cell strings ST in the unit of a row or a column.

The memory cell strings ST commonly connected to one bit line form one column. For example, the memory cell strings ST11 to ST31 connected to the bit line 0 BL0 correspond to a first column. The memory cell strings ST12 to ST32 connected to the bit line 1 BL1 correspond to a second column. The memory cell strings ST13 to ST33 connected to the bit line 2 BL2 correspond to a third column.

The strings STs connected to one string selection line SSL may form one row. For example, the strings ST11, ST12, and ST13 connected to a first string selection line SSL10 form a first row. The strings ST21, ST22, and ST23 connected to a second string selection line SSL11 form a second row. The strings ST31, ST32, and ST33 connected to a third string selection line SSL13 form a third row.

In the memory cell string ST, a height of each of the plurality of memory cells MC0 to MC4 may be defined. For example, a height of the memory cell MC0 adjacent to the second ground select transistor GST1 in the memory cell string ST compared to the substrate may be 1. In each memory cell string ST, a height of the memory cell is increased when the memory cell is adjacent to the string selection transistor SST. A height of the memory cell MC4 adjacent to the second string selection transistor SST1 compared to the substrate may be 5.

The memory cell strings STs in the same row may share the string selection line SSL. The memory cell strings STs in the different rows may be connected to the different string selection lines, respectively. The memory cells having the same height included in the memory cell strings STs in the same row may share the word line WL. At the same height, the word lines WLs of the memory cell strings STs in the different rows are commonly connected. The word lines connected to the memory cell strings in the plurality of rows at the same height may be connected to one another at an end of one side of the memory block. Further, the word lines connected to the memory cell strings in the plurality of rows at the same height may be connected to one another at ends of both sides of the memory block.

The memory cell strings STs in the same row may share the ground selection line GSL. The memory cell strings STs in the different rows may share the ground selection line GSL. For example, the memory cell strings ST11 to ST13, ST21 to ST23, and ST31 to ST33 may be commonly connected to the ground selection line GSL. Further, the memory cell strings STs may be connected to a separate ground selection line GSL in the unit of the row, similar to the string selection line. The common source line CSL may commonly connected to the memory cell strings STs.

The word lines WLs at the same height may be commonly connected. When a specific word line WL is selected, all of the memory cell strings ST connected to the specific word line WL may be selected.

The memory cell strings STs in the different rows may be connected to the different string selection lines SSL. The memory cell strings STs in an unselected row among the memory cell strings STs connected to the same word line WL may be separated from the corresponding bit line by selecting the corresponding first string selection line and second string selection line among the first string selection lines SSL10 to SSL12 and the second string selection lines SSL20 to SSL22. Further, the memory cell strings STs in a selected row may be selected in the unit of the column by selecting the bit lines BL0 to BL2.

In the example embodiment, the program voltage or the program verify voltage may be applied to the selected word line in the selected row during the program operation.

Figure 5:
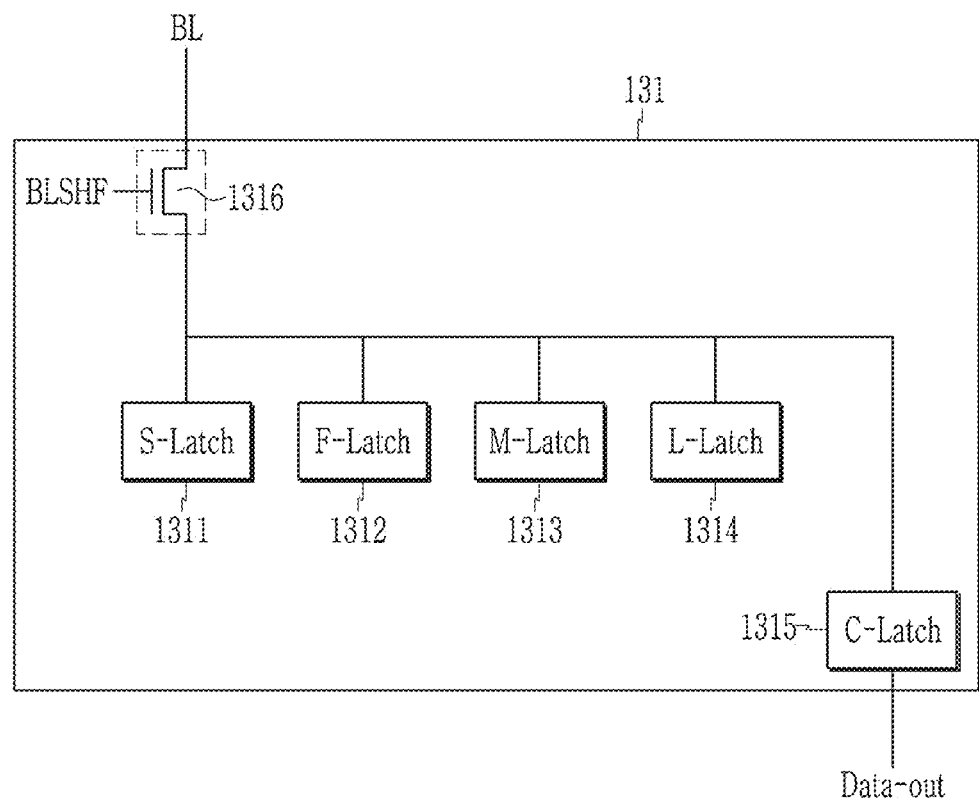
FIG. 5 is a diagram describing a page buffer according to an example embodiment in detail.

FIG. 5 is a diagram describing a page buffer according to an example embodiment in detail.

The page buffer unit 135 may include a plurality of page buffers, and FIG. 5 illustrates one of the plurality of page buffers.

During the read or program verify operation, data stored in the memory cell or a threshold voltage of the memory cell may be sensed. The page buffer 131 may include a sense latch (S-Latch) 1311 for storing a result of the sensing. Further, the sense latch 1311 may be utilized for applying a program bit line voltage Vprogram_BL or a program inhibition voltage Vinhibit to the bit line during a program execution operation.

The page buffer 131 may include a force latch (F-Latch) 1312 for improving a program threshold voltage distribution during the program operation. During the program operation, a value of the force latch 1312 may be changed according to the threshold voltage of the memory cell, and a voltage of the bit line may be varied according to a value of the force latch 1312 during the program execution. This will be described in more detail below.

The page buffer 131 may include a superordinate bit latch (M-Latch) 1313, a subordinate bit latch (L-Latch) 1314, and a cache latch (C-Latch) 1315 for storing program data input from the outside during the program operation. When data of 3 bits is programmed in one memory cell, the page buffer may store the program data of 3 bits input from the outside by using the superordinate bit latch 1313, the subordinate bit latch 1314, and the cache latch 1315. Until the program of the memory cell is completed, the superordinate bit latch 1313, the subordinate bit latch 1314, and the cache latch 1315 may maintain the stored program data. Further, the cache latch 1315 may receive data read from the memory cell during the read operation from the sense latch 1311 and may output the data to the outside of the page buffer 131 through a data output line Data-out. The superordinate bit latch 1313, the subordinate bit latch 1314, and the cache latch 1315 are generally called data latches.

The page buffer 131 may include a shut-off transistor 1316 controlling a connection between the bit line BL and the sense latch 1311 and the data latches 1313 to 1315. The shut-off transistor 1316 is controlled by a bit line shut-off signal BLSHF. For example, when or if the data is read from the memory cell, the shut-off transistor 1316 is turned on to electrically connect the bit line and the sense latch 1311. Further, the shut-off transistor 1316 may transmit the data stored in the sense latch 1311 to the cache latch 1315, or the shut-off transistor 1316 may be turned off in response to the data stored in the cache latch 1315 being transmitted to the force latch 1312.

Figure 6:
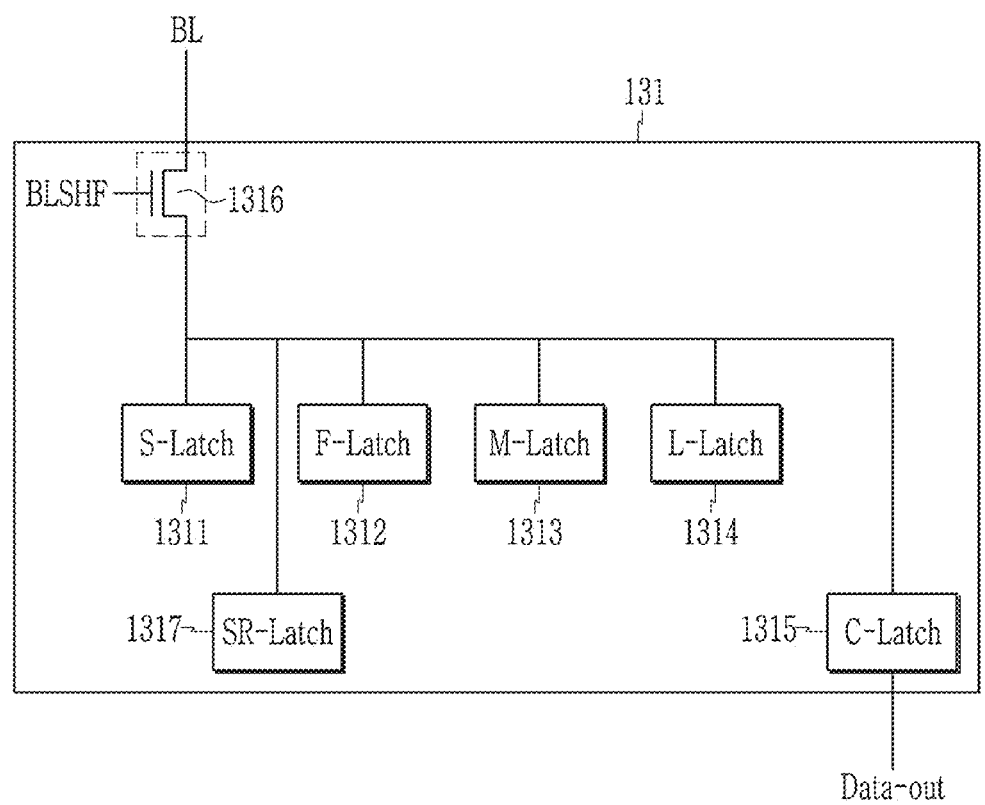
FIG. 6 is a diagram describing a page buffer according to an example embodiment in detail.

FIG. 6 is a diagram describing the page buffer according to the example embodiment in detail.

Referring to FIG. 6, the page buffer 131 may additionally include a suspend-resume latch (SR-Latch) 1317. For example, when an operation of programming data of 3 bits in one memory cell is performed, the page buffer 131 may store the program data of 3 bits by using the superordinate bit latch 1313, the subordinate bit latch 1314, and the cache latch 1315. Further, in order to improve the program threshold voltage distribution, the page buffer 131 may store information related to the program threshold voltage of the memory cell corresponding to the force latch 1312.

When or if the non-volatile memory device 100 enters the suspend state during the program operation, first, the program data stored in the cache latch 1315 may be transmitted to the suspend-resume latch 1317, and then the cache latch 1315 may be made be available. Then, the requested read operation is performed, and the sense latch 1311 reads and stores the data stored in the memory cell, on which the requested read operation is performed. The read data stored in the sense latch 1311 may be transmitted to the cache latch 1315 and may output to the outside through the data output line Data-out. After the output of the data is finished, the program data stored in the suspend-resume latch 1317 may be transmitted to the cache latch 1315 again, and the suspended program operation may be resumed.

Figure 7:
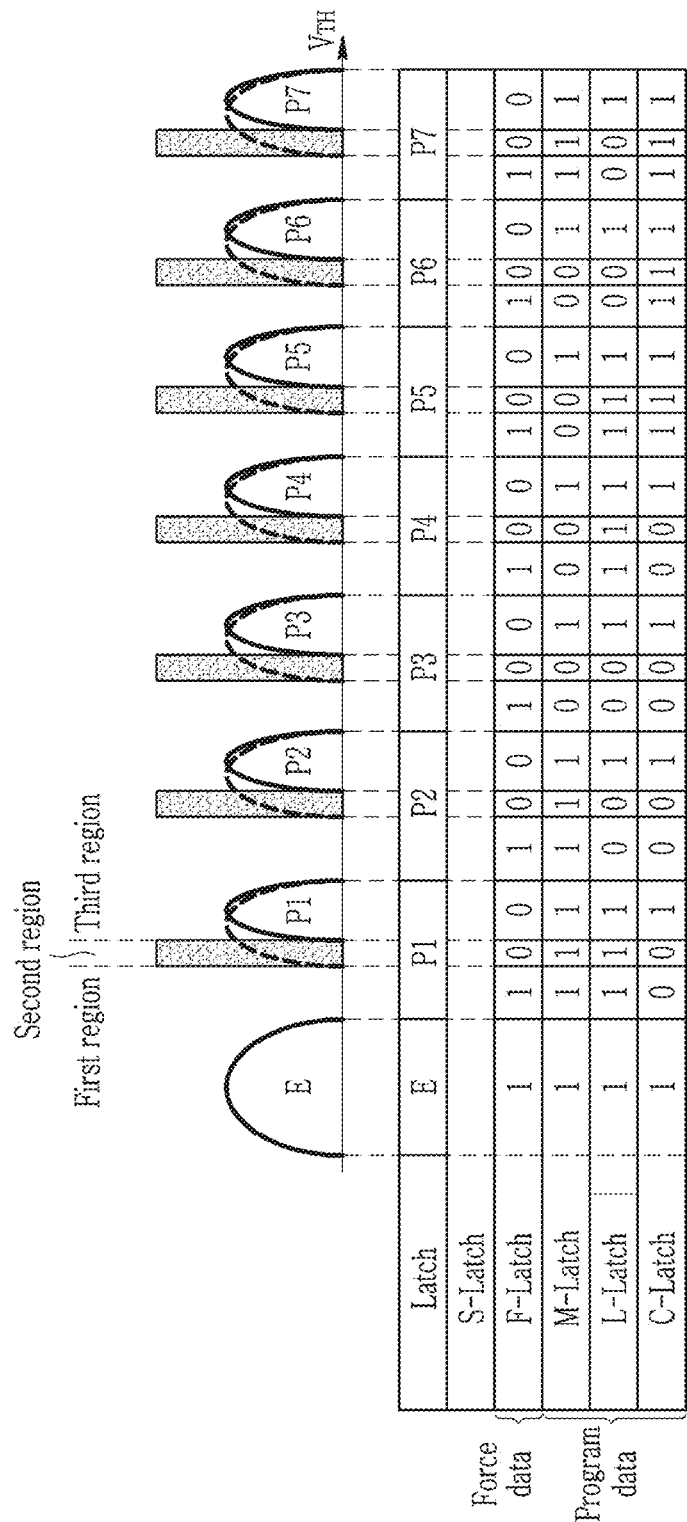
FIG. 7 is a diagram describing a page buffer latch value according to a threshold voltage of a memory cell during a program operation.

FIG. 7 is a diagram describing a page buffer latch value according to a threshold voltage of a memory cell during a program operation.

FIG. 7 illustrates values of latches included in the page buffer 131 according to a threshold voltage of a memory cell and program data when data of 3 bits is programmed in one memory cell. This is an example for describing a program operation according to an example embodiment, and inventive concepts are not limited thereto.

First, program data of 3 bits input from the outside is stored in the superordinate bit latch (M-Latch) 1313, the subordinate bit latch (L-Latch) 1314, and the cache latch (C-Latch) 1315, respectively, by 1 bit. For example, when the program data is "110", a target program threshold voltage region is P1, and "1" may be stored in the superordinate bit latch 1313, "1" may be stored in the subordinate bit latch 1314, and "0" may be stored in the cache latch 1315.

The values of the superordinate bit latch (M-Latch) 1313, the subordinate bit latch (L-Latch) 1314, and the cache latch (C-Latch) 1315 may be maintained with the program data values input from the outside before the threshold voltage of the memory cell enters a target region, and may be all changed to a value of "1" when the threshold voltage of the memory cell enters the target region. For example, in the case where the program data is "110", when the threshold voltage of the memory cells enters a first region or a second region, the values of the superordinate bit latch (M-Latch) 1313, the subordinate bit latch (L-Latch) 1314, and the cache latch (C-Latch) 1315 may be maintained with "110" that is the original program data value. When the threshold voltage of the memory cell enters a third region, all of the values of the superordinate bit latch (M-Latch) 1313, the subordinate bit latch (L-Latch) 1314, and the cache latch (C-Latch) 1315 may be changed to "1".

The force latch (F-Latch) 1312 stores force data. After the force data is initially set with "1", and when the threshold voltage of the memory cell enters a specific (or alternatively, predetermined) region, which does not reach the target region, the force data may be reversed to "0". For example, when the program data is "110", when the threshold voltage of the memory cell enters the second region, the value of the force latch 1312 may be reversed from "1" to "0". The voltage of the bit line may be controlled during the program execution operation and the program distribution may be formed to be narrower by utilizing the force data. This will be described in detail below.

FIG. 7 illustrates the first to third regions for a program state P1, but the first to third regions may be divided based on the target region for another program state.

Figure 8:
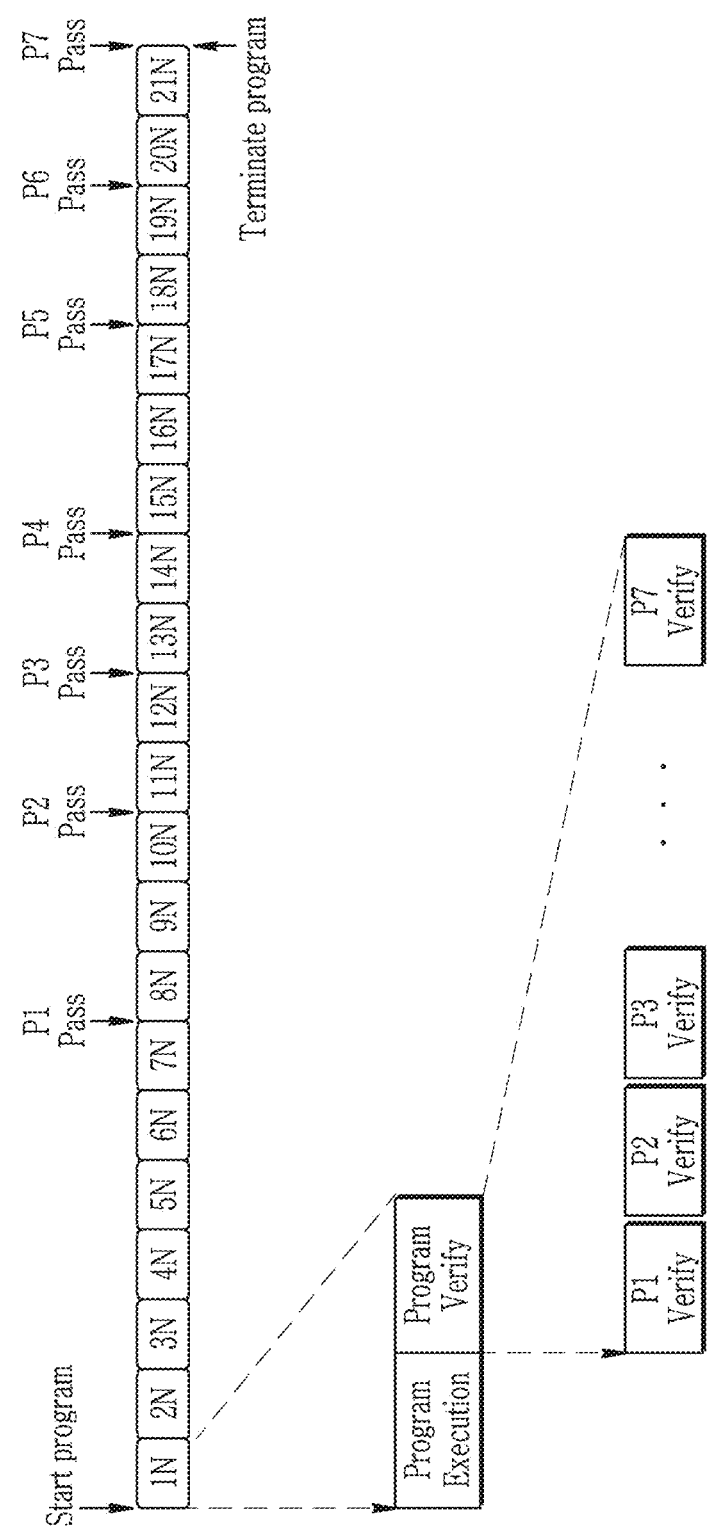
FIG. 8 is a diagram describing a program operation including a plurality of program loops.

FIG. 8 is a diagram describing a program operation including a plurality of program loops FIG. 8 represents a program operation when program data of 3 bits is programmed in one memory cell as an example. The program operation may include a plurality of program loops 1N to 21N, and each program loop may include a program execution operation and a program verify operation. If cells of the non-volatile memory 100 are configured to store three (3) bits per cell, the number of program states is a total of 7 including the program state P1 to a program state P7 as illustrated in FIG. 7. The program verify operation may include one or more of a P1 program verify operation corresponding to the program state P1 to a P7 program verify operation corresponding to the program state P7.

According to the progress of the plurality of program loops, the memory cells are gradually program passed. The program pass may correspond to the memory cells entering a target threshold voltage region. Referring to FIG. 8, all of the memory cells targeting the program state P1 having the lowest target threshold voltage may be program passed in the program loop 7N. For example, from the program loop 8N onward, there is no case where the data latches, for example, the superordinate bit latch (M-Latch) 1313, the subordinate bit latch (L-Latch) 1314, and the cache latch (C-Latch) 1315, of the page buffer 131 store "110" corresponding to the program state P1. All of the values of the superordinate bit latch (M-Latch) 1313, the subordinate bit latch (L-Latch) 1314, and the cache latch (C-Latch) 1315 corresponding to the program state P1 may be changed to "1".

After the program state P7 having the highest target threshold voltage region is program passed, the program operation is finally terminated.

Figure 9:
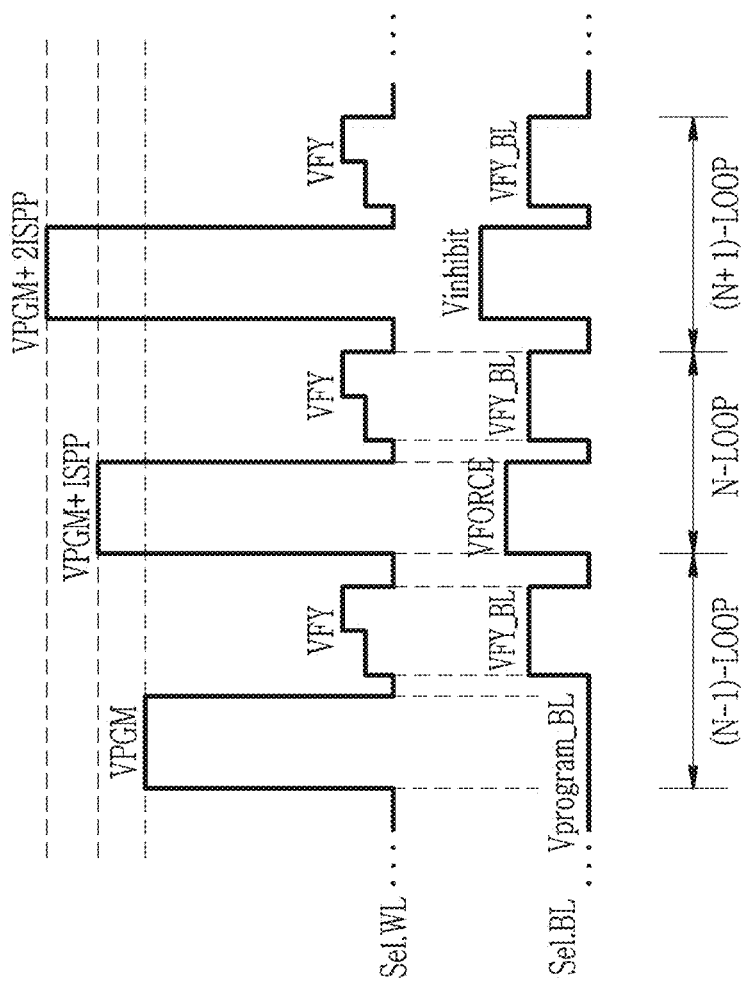
FIG. 9 is a diagram describing voltages of a word line and a bit line during a program operation.

FIG. 9 is a diagram describing voltages of a word line and a bit line during a program operation.

As described above, each program loop may include the program execution operation and the program verify operation, and the program verify operation may include one or more of a P1 program verify operation corresponding to the program state P1 to a P7 program verify operation corresponding to the program state P7. Further, generally, sizes of the program verify voltages applied to the selected word line during the P1 program verify operation to the P7 program verify operation may be different, or different from one another.

When the program execution operation of the (N−1)-loop is performed, a program voltage VPGM may be applied to a selected word line Sel. WL. Accordingly, when a threshold voltage of the selected memory cell is present in the first region (see FIG. 7), the superordinate bit latch (M-Latch) 1313, the subordinate bit latch (L-Latch) 1314, and the cache latch (C-Latch) 1315 may maintain the initial program data without a change, and a value of the force latch 1312 may be "1". As a result, a program bit line voltage Vprogram_BL may be applied to the bit line. The program bit line voltage Vprogram_BL may generally be a ground voltage. Further, after the program execution operation, the program verify operation is performed, and the program verify operation may include one or more of the P1 program verify operation to the P7 program verify operation, and a program verify voltage VFY having one or more sizes may be applied to the selected word line.

During the program execution operation in the N-loop, a voltage (VPGM+ISPP) higher than the (N−1)-loop by ISPP may be applied to the selected word line Sel. WL. Generally, a program method of uniformly increasing a program voltage applied to the selected word line while the program loop progresses is referred to as an incremental step pulse program method. Further, when the threshold voltage of the selected memory cell is present in the second region (see FIG. 7), a value of the force latch 1312 may be a value, for example, "0", reversed from the initial value, and as a result, a program force voltage VFORCE may be applied to the bit line connected to the selected memory cell. The program force voltage VFORCE may be higher than the ground voltage and lower than the program inhibition voltage Vinhibit. A size of the program threshold voltage distribution may be controlled to be narrow by using the program force voltage.

During the program execution operation in the (N+1)-loop, a voltage (VPGM+2ISPP) higher than the N-loop by ISPP may be applied to the selected word line Sel. WL by the incremental step pulse program method. Further, when the threshold voltage of the selected memory cell is present in the third region (see FIG. 7), all of the data latches of the page buffer 131 corresponding to the selected memory cell may have a value of "1", and as a result, the program inhibition voltage Vinhibit may be applied to the bit line connected to the selected memory cell. The program inhibition voltage Vinhibit is generally an internal power voltage VCC.

Figure 10:
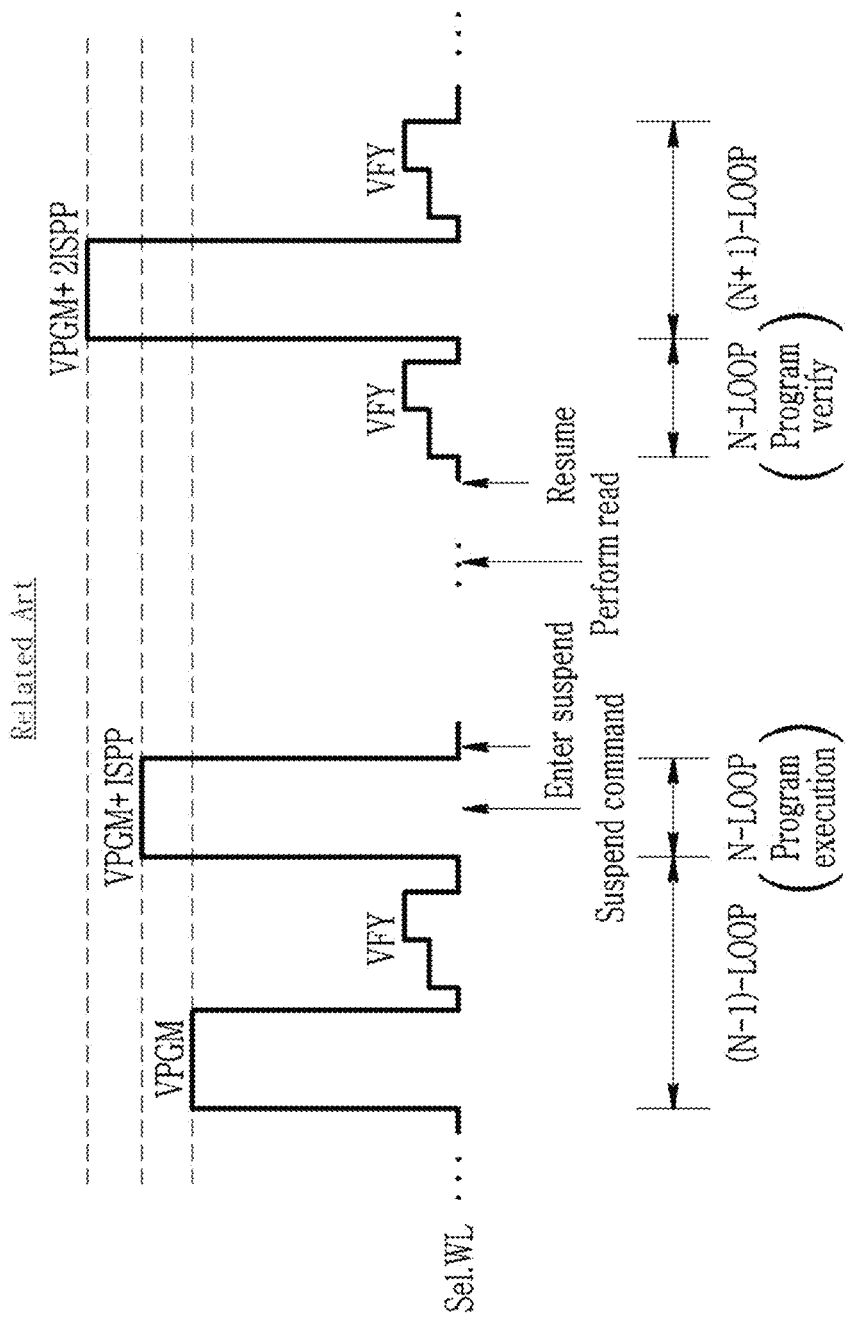
FIG. 10 is a diagram describing a suspend-resume operation during a program operation in the related art.

FIG. 10 is a diagram describing a suspend-resume operation during a program operation in the related art.

When a suspend command is input during the program execution operation of the N-loop, after the currently performed program execution operation is completed, the non-volatile memory device 100 may enter the suspend state. Then, the requested read operation may be performed, and then the suspended program operation may be resumed. The resumed program operation may start with the program verify operation of the N-loop following the previously performed program execution operation of the N-loop.

Accordingly, unlike other program loops, a time interval caused by the performance of the requested read operation is generated between the program execution operation and the program verify operation of the N-loop unlike other program loops. During the time interval, a charge loss phenomenon, in which charges existing in a floating gate or a charge trap layer of the memory cell are discharged to the outside, may be generated, and a threshold voltage of the memory cell may be decreased.

For example, when the threshold voltage of the memory cell substantially enters the third region of FIG. 7 by the program execution operation of the N-loop, and the program verify operation is immediately performed after the program execution without the suspend-resume operation, the memory cell may be determined to be program passed. However, when the non-volatile memory device 100 enters the program suspend operation after the program execution operation by the suspend command, the threshold voltage of the memory cell may be lowered to the second region by the charge loss phenomenon for a time between the suspend and the resume. Accordingly, the threshold voltage may be determined as the second region by the program verify operation performed after the program resume. As the result, the program execution operation is performed on the corresponding memory cell in the (N+1)-loop again, and the threshold voltage may be formed to be higher than the target.

Figure 11A:
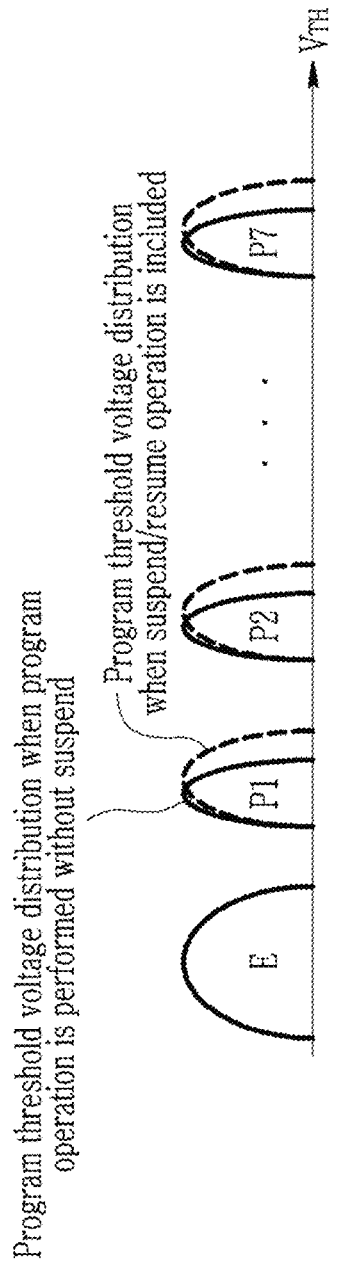
FIG. 11A is a diagram describing the deterioration of a program threshold voltage distribution by a suspend-resume operation during a program operation in the related art.

FIG. 11A is a diagram describing the deterioration of a program threshold voltage distribution by the suspend-resume operation in the related art.

As illustrated with a dotted line in FIG. 11A, a program threshold voltage distribution may be widened to the right side by an over program. The deterioration of the program threshold voltage distribution may be higher in the 3D flash memory device, in which the charge trap layer is applied as a space for storing charges, instead of the floating gate, in the memory cell. Further, the deterioration of the program threshold voltage distribution may cause a read fail during the performance of the read operation after the termination of the program operation, thereby degrading reliability of the flash memory device.

Figure 11B:
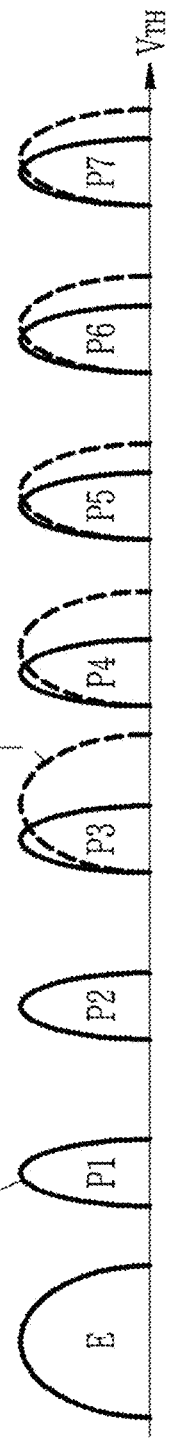
FIG. 11B is a diagram describing the deterioration of a program threshold voltage distribution by a suspend-resume operation after pass P2 during a program operation in the related art.

FIG. 11B is a diagram in the related art describing the deterioration of a program threshold voltage distribution by a suspend-resume operation after pass P2 during a program operation.

As illustrated in FIG. 11B, the program threshold voltage distributions in P1 and P2 are not influenced by the suspend-resume operation. However, the program threshold voltage distributions in P3, P4, P5, P6, and P7 are widened to the right side by the suspend-resume operation after pass P2. A degree of widening of the program threshold voltage distribution to the right side may be P3>P4>P5>P6>P7. Accordingly, the degrees of expansion of the program threshold voltage distributions to the right side in P5, P6, and P7 may be substantially the same.

Figure 12:
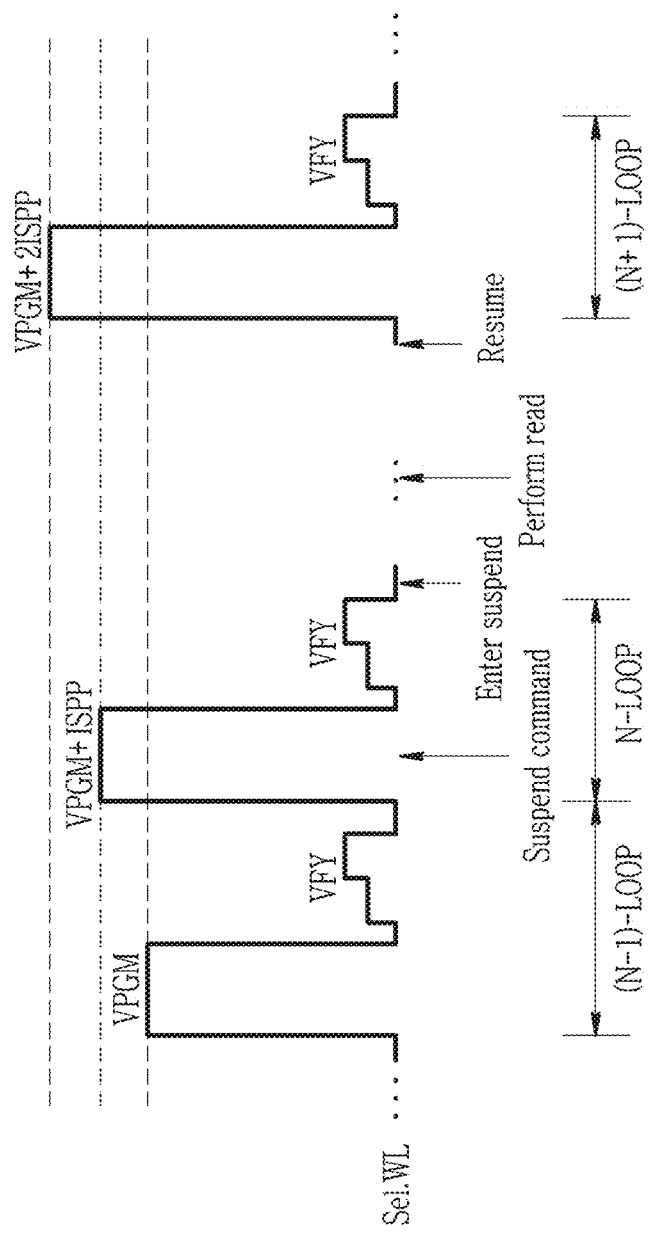
FIG. 12 is a diagram describing a suspend-resume operation during a program operation according to an example embodiment.

FIG. 12 is a diagram describing a suspend-resume operation during a program operation according to an example embodiment.

As illustrated in FIG. 12, when the suspend command is input during the program execution operation of the N-loop, the non-volatile memory device 100 may enter the suspend state after completing up to the program verify operation of the N-loop without immediately entering the suspend state after finishing the program execution operation. For example, after all of the program verify operations, which are designed to be performed on the N-loop, among the P1 program verify operation to the P7 program verify operation are completed, the non-volatile memory device 100 may enter the suspend state.

The requested read operation may be performed after the non-volatile memory device 100 enters the suspend state, and after the read operation is terminated, the suspended program operation may be resumed. The resumed program operation may start with the program execution operation of the (N+1)-loop, and the program voltage applied to the selected word line may be VPGM+2ISPP higher than the N-loop by ISPP.

During the performance of the read operation after the entrance to the suspend state, as described with reference to FIG. 6, first, the program data stored in the cache latch 1315 may be transmitted to the suspend-resume latch 1317, and the data of the memory cell, on which the read operation is performed, may be temporarily stored in the sense latch 1311, and then may be transmitted to the cache latch 1315 and may output to the outside. Then, the program data transmitted to the suspend-resume latch 1317 may be transmitted to the cache latch 1315 again, and the suspended program operation may be resumed.

Figure 13:
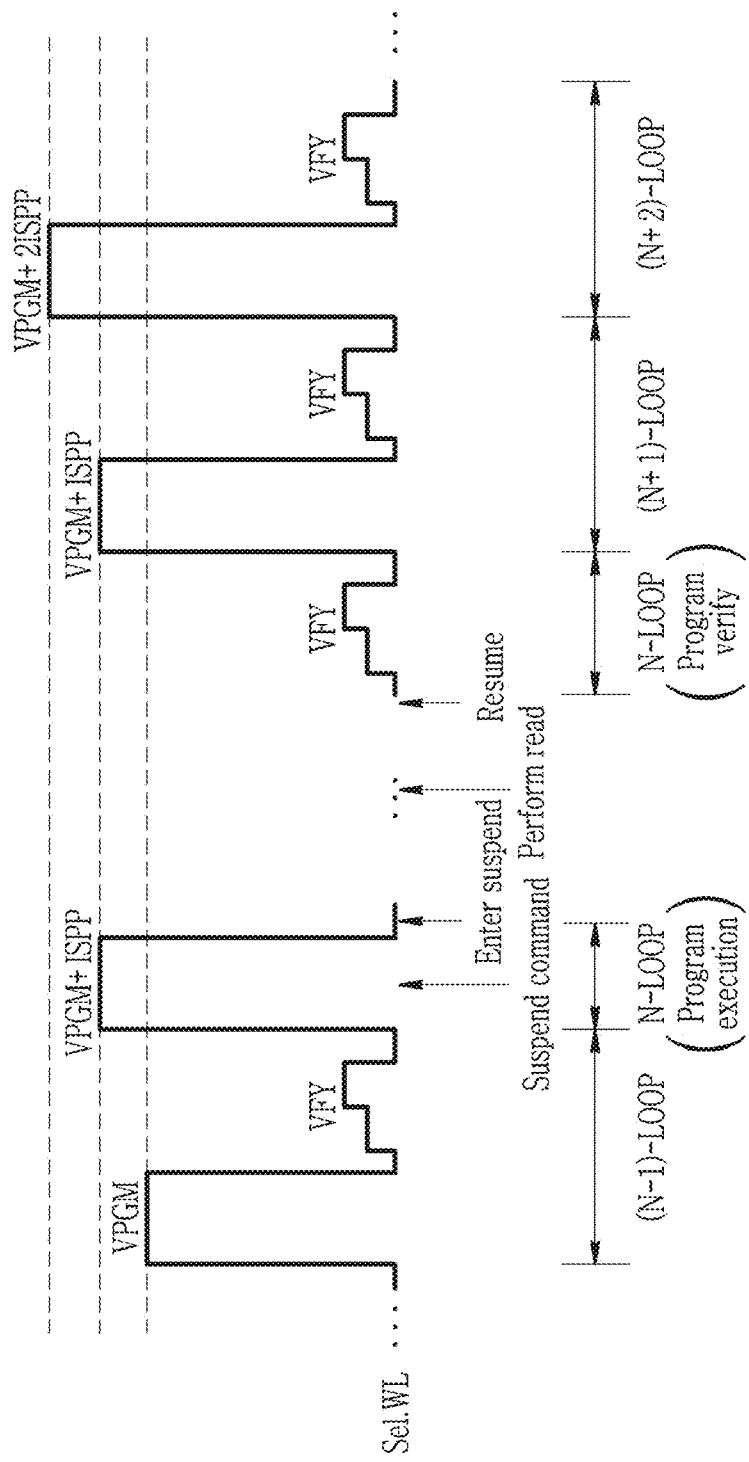
FIGS. 13 and 14 are diagrams for describing a suspend-resume operation during a program operation according to an example embodiment.
Figure 14:
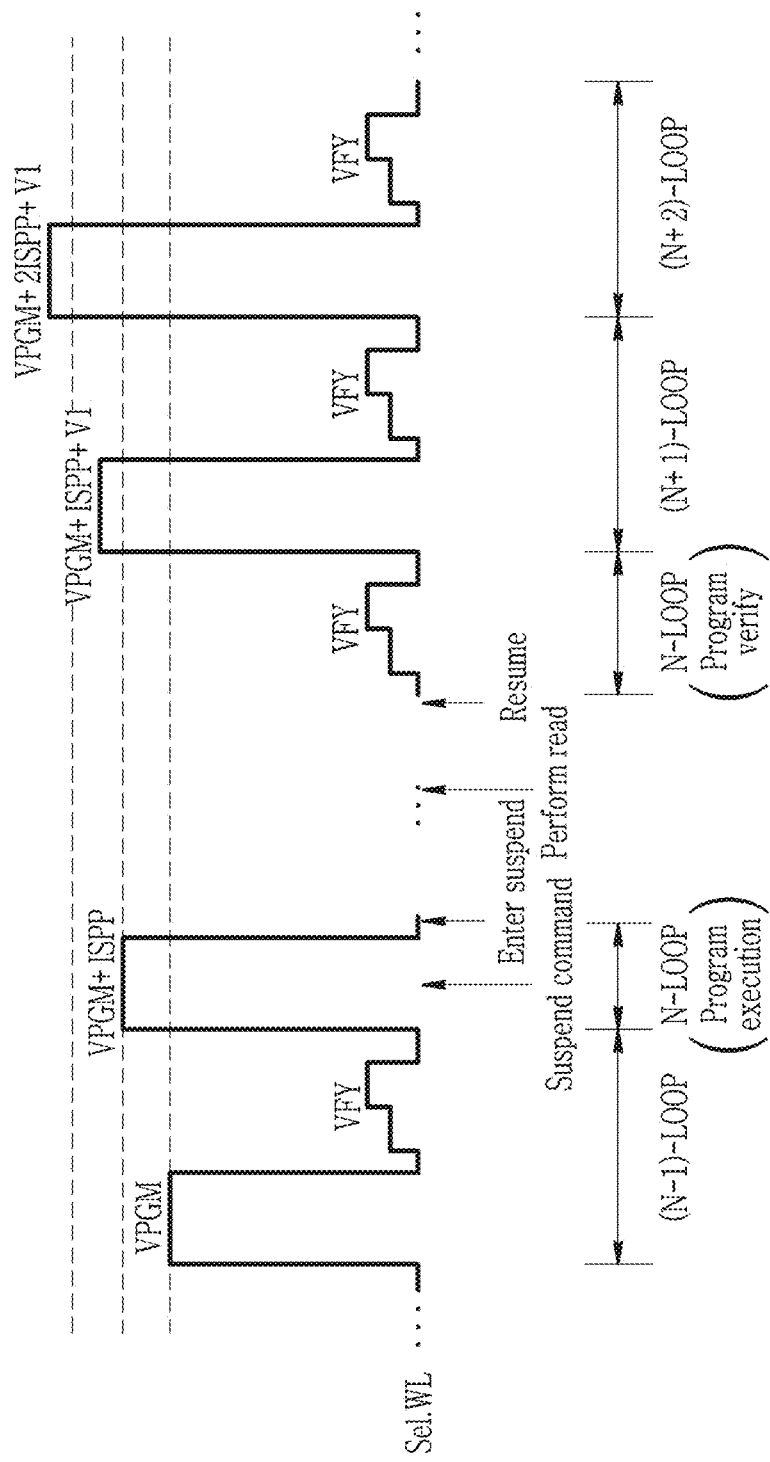

FIGS. 13 and 14 are diagrams for describing a suspend-resume operation during a program operation according to an example embodiment.

Referring to FIG. 13, when a suspend command is input during the program execution operation of the N-loop, the non-volatile memory device 100 may immediately enter the suspend state without the performance of the program verify operation after finishing the program execution operation. The requested read operation may be performed after the entrance to the suspend state, and the suspended program operation is resumed after the performance of the read operation is completed. Accordingly, the resumed program operation may start with the program verify operation of the N-loop. Accordingly, there is concern that the program threshold voltage distribution deteriorates as described with reference to FIGS. 10 and 11. Accordingly, the program voltage applied to the selected word line during the program execution operation of the (N+1)-loop may be applied with the same voltage (VPGM+ISPP) as that of the N-loop or more. Even though the threshold voltage of the memory cell is decreased by a charge loss during the time interval between the suspend and the resume, the program voltage is not increased, so that the program threshold voltage distribution may not deteriorate.

Further, referring to FIG. 14, unlike FIG. 13, a voltage (VPGM+ISPP+V1) higher than the program voltage (VPGM+ISPP) in the N-loop by V1 may be applied in the (N+1)-loop. V1 may be a value less than that of ISPP, and may be a value by which the deterioration of the program threshold voltage distribution described with reference to FIGS. 10 and 11 is not incurred or induced. Then, the program execution operation may be performed by applying a voltage (VPGM+2ISPP+V1) higher than the program voltage (VPGM+ISPP+V1) of the (N+1)-loop by ISPP. Or the program execution operation may be performed by applying a voltage (VPGM+ISPP+V1+V1') higher than the program voltage (VPGM+ISPP+V1) of the (N+1)-loop by V1' in the (N+2)-loop. In this case, V1' may be the level less than V1.

Figure 15:
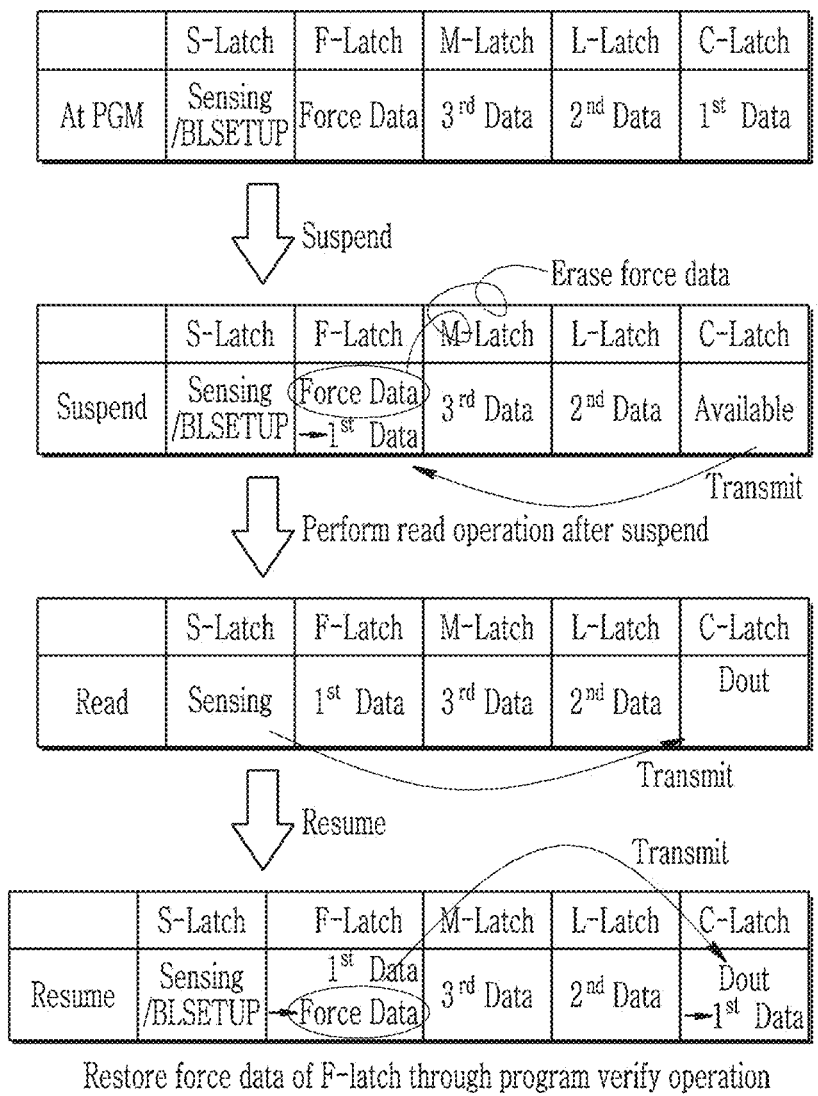
FIG. 15 is a diagram for describing an operation of a page buffer for a suspend-resume operation during a program operation according to an example embodiment.

FIG. 15 is a diagram for describing an operation of the page buffer for a suspend-resume operation during a program operation according to an example embodiment.

As illustrated in FIG. 5, when the page buffer 131 does not include the separate suspend-resume latch 1317 illustrated in FIG. 6, any one of the force latch 1312, the superordinate bit latch 1313, the subordinate bit latch 1314, and the cache latch 1315 is desired to be made available for the performance of the requested read operation after the entrance to the suspend state. As an example, a method using the force latch 1312 will be described with reference to FIG. 15.

First, when the program is performed, program data is stored in the superordinate bit latch 1313, the subordinate bit latch 1314, and the cache latch 1315, and force data determining whether to apply the program force voltage VFORCE to the bit line during the program execution operation is stored in the force latch 1312.

When the suspend command is input, the force data stored in the force latch 1312 is erased and the program data stored in the cache latch 1315 is transmitted to the force latch 1312 to make the cache latch 1315 be in an available state.

Then, the non-volatile memory device 100 enters the suspend and the requested read operation is performed. During the read operation, the data stored in the memory cell is temporarily stored in the sense latch 1311 and then is output to the outside through the cache latch 1315.

When the program operation is resumed after the termination of the requested read operation, the program data, which had been transmitted from the cache latch 1315 to the force latch 1312 before the performance of the read operation, may be transmitted to the cache latch 1315 again, and the force data of the force latch 1312 may be restored through the program verify operation or through an initial verify operation.

For example, in the case of FIGS. 13 and 14, the program resume starts with the program verify operation of the N-loop, and in this case, the force data of the force latch 1312 may be restored again. Then, controlling the program bit line voltage according to the force data of the force latch 1312 during the program execution operation of the (N+1)-loop may be possible.

Figure 16:
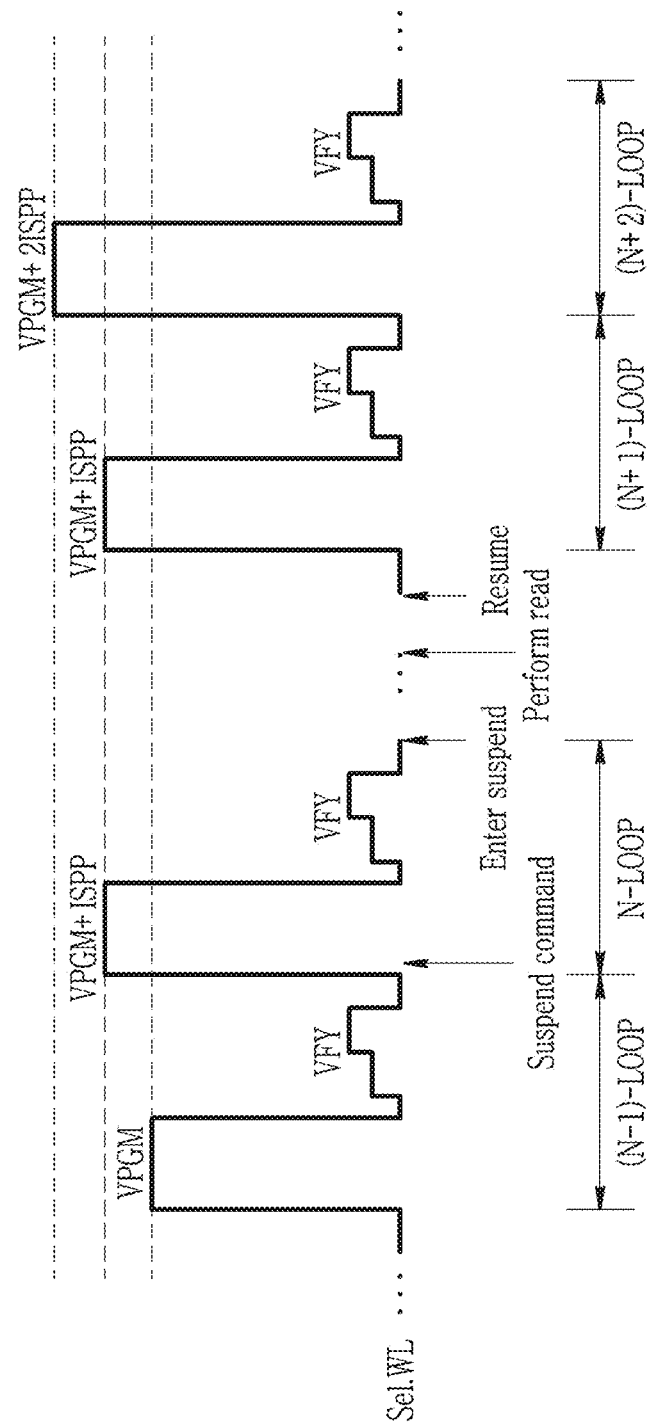
FIGS. 16 and 17 are diagrams describing a suspend-resume operation during a program operation according to an example embodiment.
Figure 17:
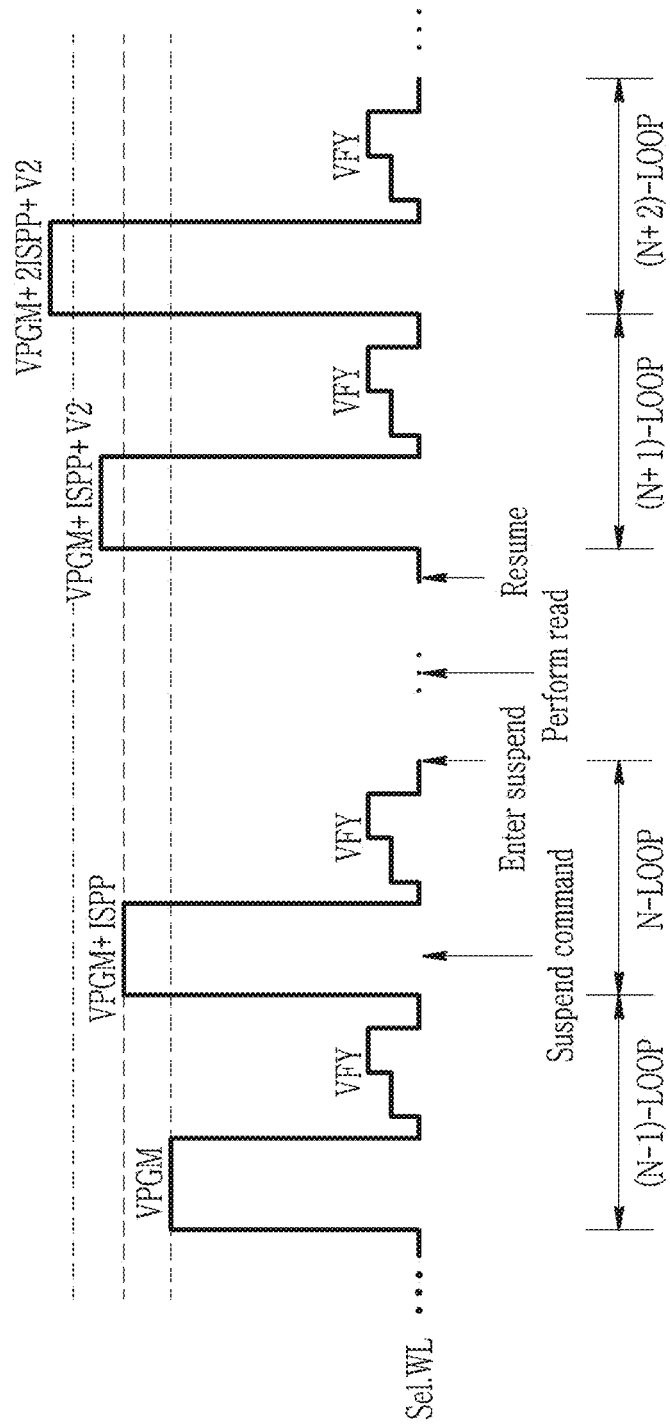

FIGS. 16 and 17 are diagrams describing a suspend-resume operation during a program operation according to an example embodiment.

Referring to FIG. 16, when the suspend command is input during the program execution operation of the N-loop, the non-volatile memory device 100 may not immediately enter the suspend state after the completion of the program execution operation, and the non-volatile memory device 100 may enter the suspend after completing up to the program verify operation of the N-loop.

Then, the requested read operation is performed, and accordingly, the requested read operation may be performed by using the force latch 1312 as described with reference to FIG. 15. For example, before the requested read operation is performed, the force data of the force latch 1312 is erased and the program data stored in the cache latch 1315 may be transmitted to the force latch 1312 to make the cache latch 1315 be in an available state. The requested read operation temporarily stores the read data in the sense latch 1311 and then outputs the data to the outside through the cache latch 1315. After the requested read operation is performed, the program data stored in the force latch 1312 may be transmitted to the cache latch 1315 again.

Then, the program operation is resumed, and accordingly, the resumed program operation may start with the program execution operation of the (N+1)-loop. Accordingly, the program execution operation of the (N+1)-loop may be performed in the state where the force data of the force latch 1312 is not restored. In this case, when the program voltage, for example, VPGM+2ISPP, higher than the program voltage in the N-loop by ISPP is applied to the selected word line during the program execution operation of the (N+1)-loop, the program threshold voltage distribution may deteriorate. Accordingly, the program execution operation may be performed by applying the program voltage VPGM+ISPP, which is the same as the program voltage of the N-loop, in the (N+1)-loop, and the force data of the force latch 1312 may be restored during the program verify operation of the (N+1)-loop. Then, when the program execution of the (N+2)-loop is performed, the program execution operation may be performed by applying a program voltage (VPGM+2ISPP) higher than that of the previous loop by ISPP. As a result, reducing the likelihood of the program threshold voltage distribution from deteriorating may be possible.

Further, as illustrated in FIG. 17, applying a program voltage (VPGM+ISPP+V2) obtained by increasing the program voltage by V2 compared to that of the N-loop to the selected word line when the program execution operation of the (N+1)-loop is performed may also be possible. A size of V2 may be determined as a size which is smaller than ISPP and by which the program threshold voltage distribution does not deteriorate.

Figure 18:
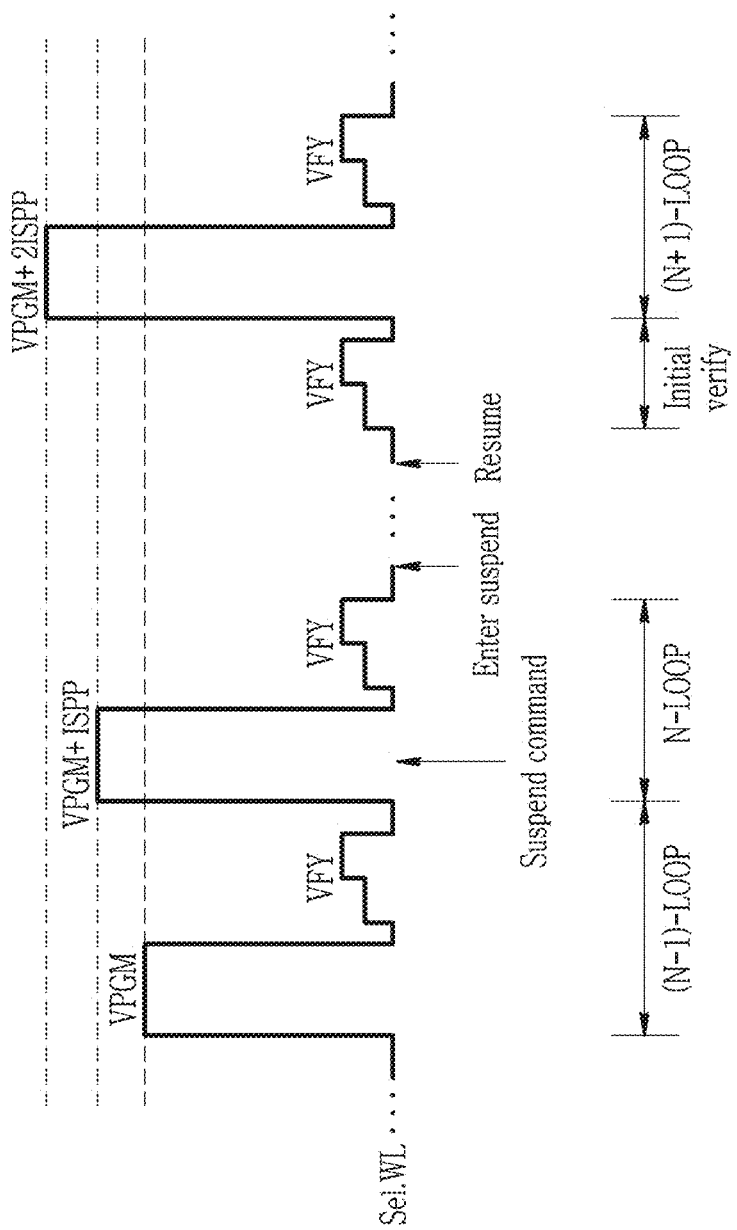
FIG. 18 is a diagram describing a suspend-resume operation during a program operation according to an example embodiment.

FIG. 18 is a diagram describing a suspend-resume operation during a program operation according to an example embodiment.

Referring to FIG. 18, when the suspend command is input during the program execution operation of the N-loop, the non-volatile memory device 100 may enter the suspend after completing up to the program verify operation of the N-loop. The requested read operation is performed after the entrance to the suspend state, and in this case, the requested read operation may be performed by using the force latch 1312 and the cache latch 1315 as described with reference to FIG. 15.

After the requested read operation is completed, the resumed program operation may start with the initial verify operation. The force data of the force latch 1312 erased for the read operation may be restored during the initial verify operation. Then, the program execution operation of the (N+1)-loop is performed, and the program voltage in this case may use the program voltage VPGM+2ISPP higher than that of the N-loop by ISPP. Further, controlling the bit line voltage by using the restored force data of the force latch 1312 during the program execution operation of the (N+1)-loop may also be possible. As a result, reducing the likelihood of the program threshold voltage distribution from deteriorating may be possible.

Figure 19:
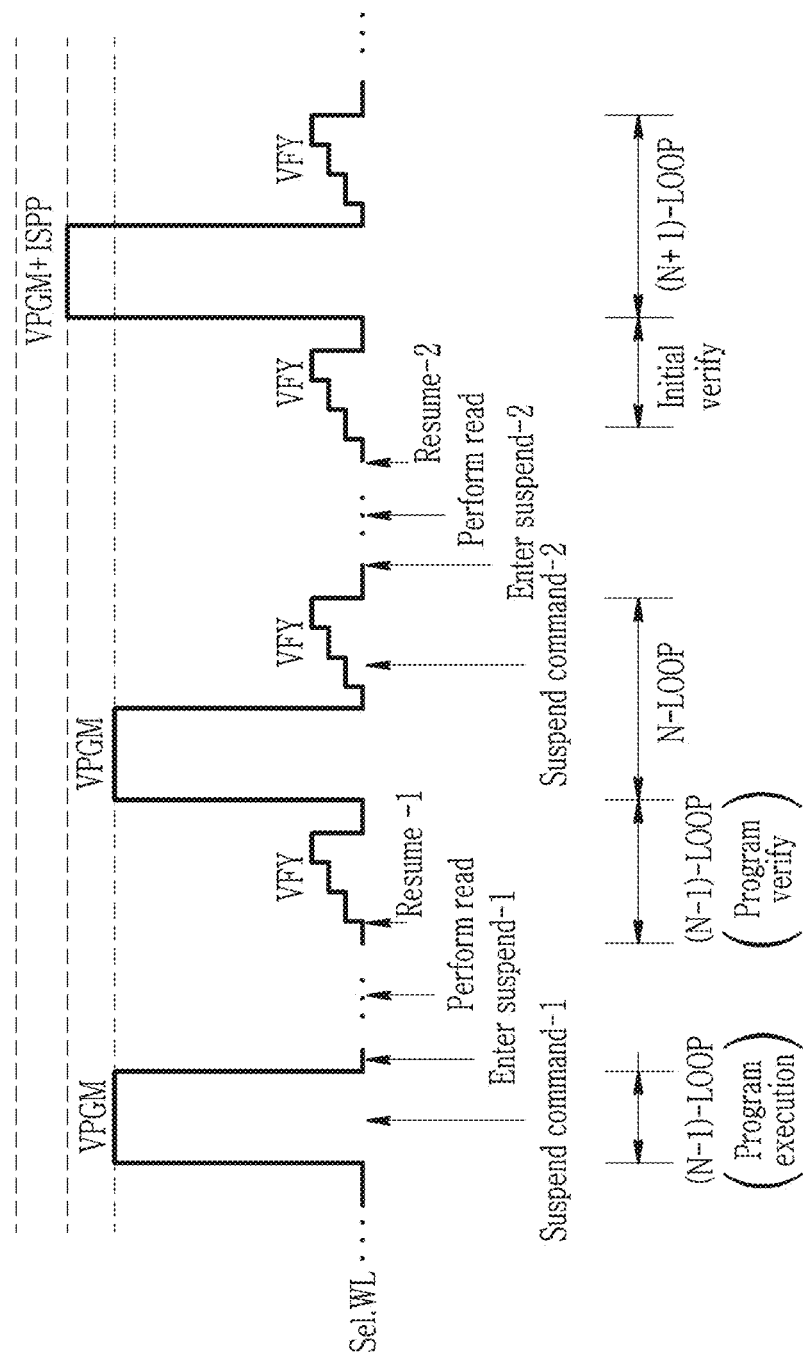
FIG. 19 is a diagram describing a suspend-resume operation during a program operation according to an example embodiment.

FIG. 19 is a diagram describing a suspend-resume operation during a program operation according to an example embodiment.

The aforementioned several example embodiments may be combined and applied. FIG. 19 represents an example of the combination. First, when the suspend command is input during the program execution operation of the (N−1)-loop, the non-volatile memory device 100 may immediately enter the suspend after the termination of the program execution operation as illustrated in FIG. 13. The requested read operation is performed after the entrance to the suspend state, and the program operation is resumed after the performance of the read operation is completed. The resumed program operation may start with the program verify operation of the (N−1)-loop. Further, the force data of the force latch 1312 may be restored during the program verify operation of the (N−1)-loop. Then, in the program execution operation of the N-loop, the same voltage as the program voltage VPGM in the (N−1)-loop may be applied as illustrated in FIG. 13.

The program execution operation of the N-loop is terminated, and the program verify operation starts. As an example, the program verify operation of the N-loop is assumed to include a P1 program verify operation, a P2 program verify operation, and a P3 program verify operation, and when the suspend command is input during the P1 program verify operation, the non-volatile memory device 100 does not immediately enter the suspend after the completion of the P1 program verify operation, but the non-volatile memory device 100 may enter the suspend after the completion of the P2 and P3 program verify operations. Then, the requested read operation is performed by using the method of erasing the force data of the force latch 1312, and the program operation is resumed after the completion of the read operation. The resumed program operation may start with the initial verify operation. The force data of the force latch 1312 may be restored during the initial verify operation. Then, in the program execution operation of the (N+1)-loop, the voltage (VPGM+ISPP) higher than the program voltage in the N-loop by ISPP may be applied as illustrated in FIG. 18.

Figure 20:
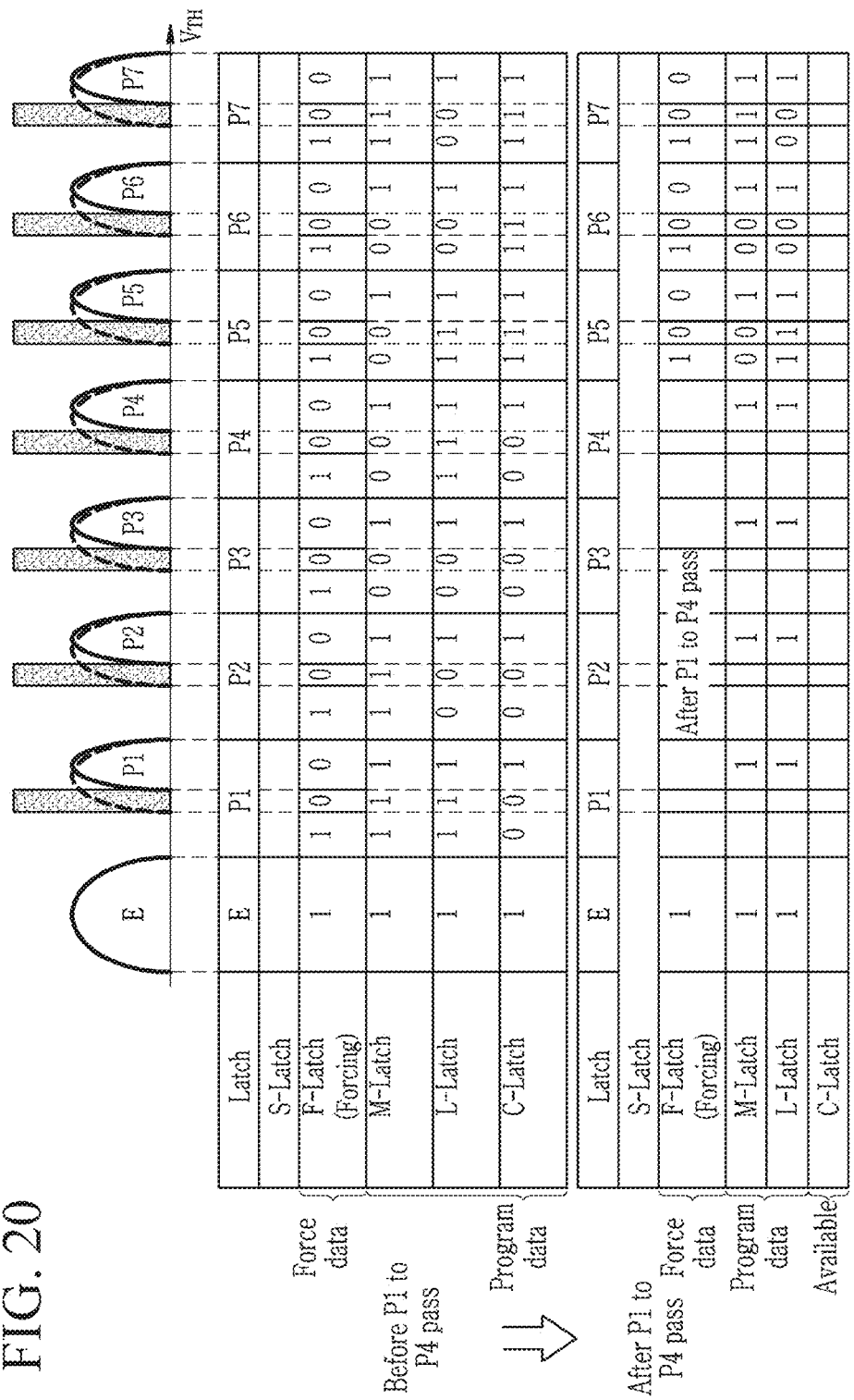
FIG. 20 is a diagram describing a page buffer latch value according to a threshold voltage of a memory cell during a program operation according to an example embodiment.
Figure 21:
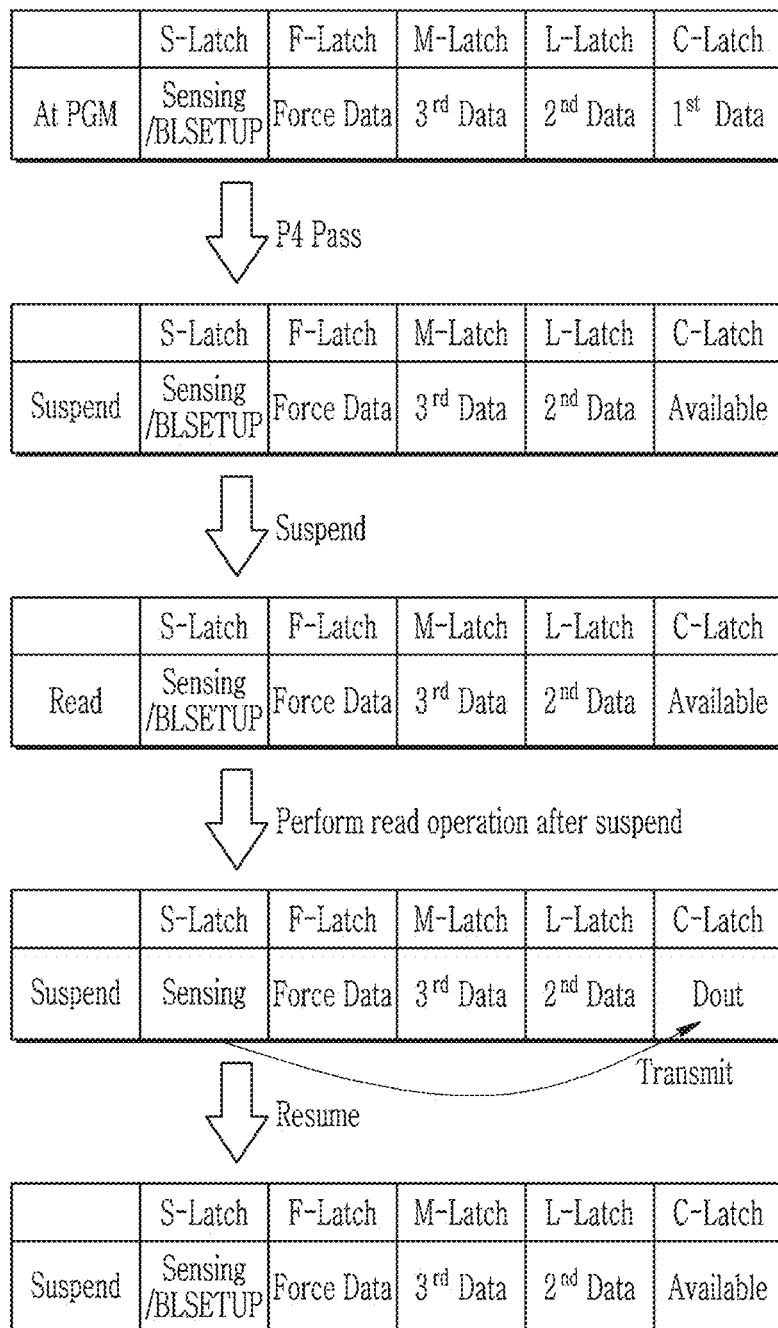
FIG. 21 is a diagram describing an operation of a page buffer for a suspend-resume operation during a program operation according to an example embodiment.

FIG. 20 is a diagram describing a page buffer latch value according to a threshold voltage of a memory cell during a program operation according to an example embodiment. Further, FIG. 21 is a diagram describing an operation of the page buffer for a suspend-resume operation during a program operation according to an example embodiment.

As described with reference to FIG. 8, the memory cells are sequentially program-passed while the plurality of program loops progresses. In this case, when all of the memory cells targeting the program state P1 to the memory cells targeting the program state P4 are program-passed, the memory cells targeting the program states P5 to P7, which are not program-passed yet, are left. For example, only the three program states are the non-program-passed state. In this case, the existing program data expressed with 3 bits may be expressed with 2 bits by decreasing 1 bit. For example, the erase state E and the program states P1 to P4 may be expressed with "11", and the program state P5 may be expressed with "01", the program state P6 may be expressed with "00", and the program state P7 may be expressed with "10". Accordingly, the program data may be expressed with 2 bits, so that one of the data latches may be made be in an available state. The case of FIG. 20 is a case where after the program pass of the program state P1 to the program state P4, the cache latch 1315 is made be available.

When the program states P1 to P4 are program-passed and then the cache latch 1315 is made available as described above, the available cache latch 1315 may be used without erasing the force data of the force latch 1312 during the read operation after the entrance to the suspend state. In this case, the non-volatile memory device 100 may immediately enter the program execution operation of the (N+1)-loop without performing the initial verify operation described with reference to FIG. 18 when the program operation is resumed, and program performance may be improved compared to the case where the initial verify operation is performed.

Accordingly, before the program state P1 to the program state P4 are program-passed, the program resume operation may start with the initial verify operation as illustrated in FIG. 18, and after the program state P1 to the program state P4 are program-passed, the program resume operation may immediately start with the program execution operation of the (N+1)-loop without the initial verify operation.

According to example embodiments, performing the suspend-resume operation for every program loop may be possible, and reducing the likelihood of the program threshold voltage distribution from deteriorating may be possible.

Figure 22:
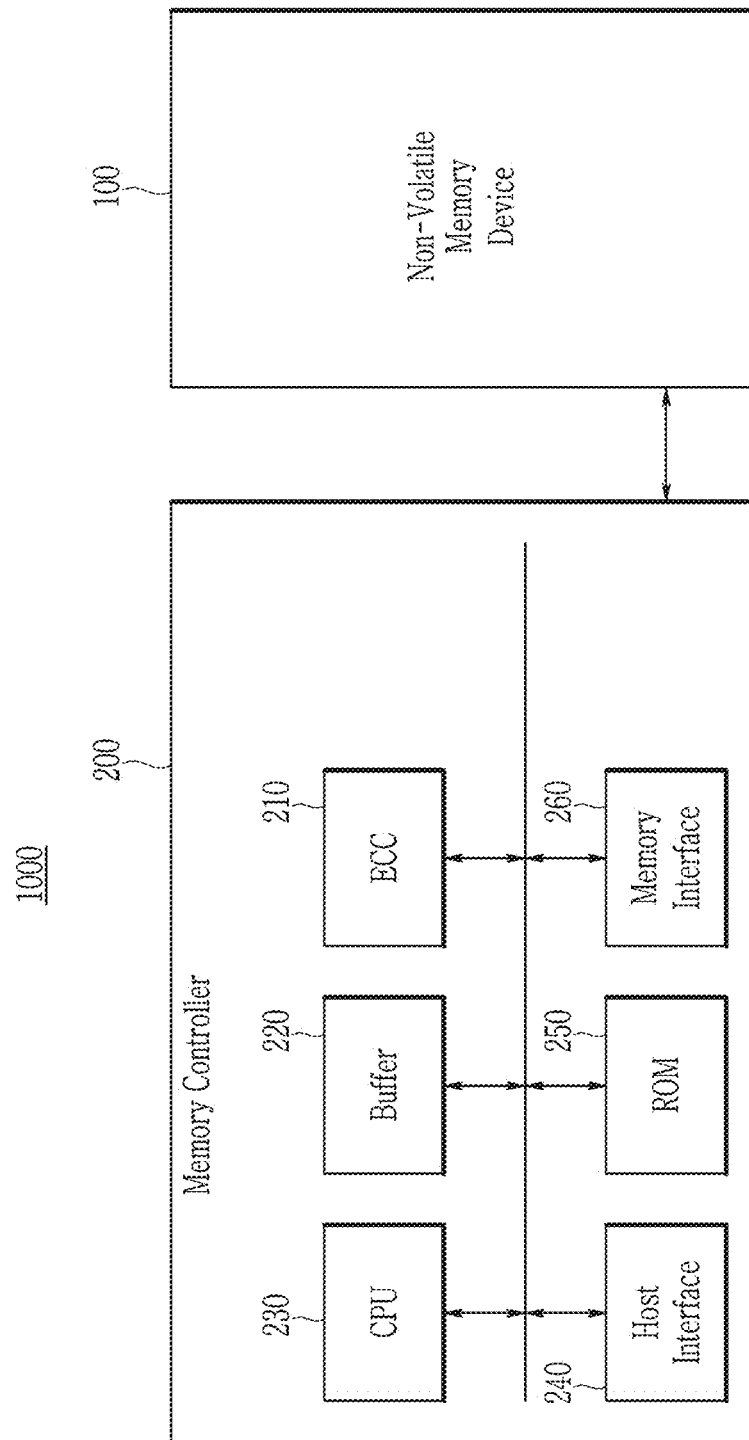
FIG. 22 is a diagram describing a memory system.

FIG. 22 is a diagram describing a memory system.

Referring to FIG. 22, a memory system 1000 may include a non-volatile memory device 100 and a memory controller 200. The non-volatile memory device 100 is the same as the aforementioned non-volatile memory device 100, accordingly, a detailed description thereof will be omitted.

The memory controller 200 controls the non-volatile memory device 100 according to a request of the outside (for example, a host). In the example embodiment, the memory controller 200 may apply a command and an address to the non-volatile memory device 100, and control read, program, and erase operations.

The memory controller 200 may be connected between the non-volatile memory device 100 and a host. The memory controller 200 may drive firmware for controlling the non-volatile memory device 100. The memory controller 200 may include an error correction circuit (ECC) 210, a buffer 220, a central processing unit (CPU) 230, a host interface 240, a ROM 250, and a memory interface 260.

The central processing unit 230 controls a general operation of the memory controller 200. The buffer 220 may be used as an operation memory of the central processing unit 230. When a writing request is made from the host, data input from the host may be temporarily stored in the buffer 220. Further, when read is requested from the host, data read from the non-volatile memory device 100 may be temporarily stored in the buffer 220. The error correction circuit 210 encodes the data stored in the buffer 220 by using an error correction code when writing is requested. For example, the encoded data and parity data imposed on the encoded data are stored in a memory cell array included in the non-volatile memory device 100. In the meantime, the error correction circuit 210 may decode data read from the non-volatile memory device 100 by using an error correction code value when the read is requested. The ROM 250 may store data required for driving the memory controller 200.

The host interface 240 includes a protocol for performing data exchange between the host and the memory controller 200.

The memory interface 260 interfaces the non-volatile memory device 100 and the memory controller 200.

The memory controller 200 and the non-volatile memory device 100 may be connected on a common substrate, for example, a printed circuit board.

While this invention has been described in connection with what is presently considered to be practical example embodiments, it is to be understood that inventive concepts are not limited to the disclosed embodiments, but, on the contrary, is intended to cover various modifications and equivalent arrangements included within the spirit and scope of the appended claims.

What is claimed is:

1. A method of programming a non-volatile memory device stacked on a substrate in a vertical direction and including a plurality of memory cells connected to a plurality of word lines and a plurality of bit lines, the method comprising:
receiving a program command;
selecting a first word line of the plurality of word lines in response to the program command;
applying a first program voltage to the first word line in response to the program command;
receiving a first suspend command;
applying a first verify voltage to the first word line in response to the first suspend command;
entering a first suspend state in response to the first suspend command;
receiving a first read command;

reading a data from a first memory cell connected to a second word line of the plurality of word lines in response to the first read command;
receiving a first resume command;
applying a second verify voltage to the first word line in response to the first resume command; and
applying a second program voltage to the first word line in response to the first resume command.

2. The method of claim 1, wherein the second program voltage is greater than the first program voltage.

3. The method of claim 2, further comprising:
applying a third program voltage to the first word line in response to the program command before applying the first program voltage to the first word line,
wherein the third program voltage is lower than the first program voltage.

4. The method of claim 2, further comprising:
applying a third program voltage to the first word line in response to the program command before applying the first program voltage to the first word line,
wherein the third program voltage is equal to the first program voltage.

5. The method of claim 4, further comprising:
receiving a second suspend command during applying the third program voltage to the first word line;
entering a second suspend state in response to the second suspend command;
receiving a second read command;
reading a data from a second memory cell connected to a third word line of the plurality of word lines in response to the second read command;
receiving a second resume command;
applying a third verify voltage to the first word line in response to the second resume command before applying the first program voltage to the first word line.

6. The method of claim 1, wherein applying the first verify voltage to the first word line includes:
applying a third verify voltage to the first word line, and
applying a fourth verify voltage larger than the third verify voltage to the first word line.

7. The method of claim 6, wherein the first suspend command is received during applying the third verify voltage to the first word line.

8. The method of claim 1, further comprising:
providing first latch storing a first program data and a second latch storing a second program data;
transmitting the first program data in the first latch to the second latch in response to the first suspend command; and,
transmitting the first program data in the second latch to the first latch in response to the first resume command.

9. The method of claim 8, further comprising:
restoring the second program data in the second latch by applying the second verify voltage to the first word line.

10. A method of programming a non-volatile memory device stacked on a substrate in a vertical direction and including a plurality of memory cells connected to a plurality of word lines and a plurality of bit lines, the method comprising:
receiving a program command;
selecting a first word line of the plurality of word lines in response to the program command;
applying a first program voltage to the first word line in response to the program command;
receiving a first suspend command;
entering a first suspend state in response to the first suspend command;
receiving a first read command;
reading a data from a first memory cell connected to a second word line of the plurality of word lines in response to the first read command;
receiving a first resume command;
applying a first verify voltage to the first word line in response to the first resume command; and
applying a second program voltage to the first word line in response to the first resume command.

11. The method of claim 10, wherein the second program voltage is equal to the first program voltage.

12. The method of claim 11, further comprising:
providing first latch storing a first program data and a second latch storing a second program data;
transmitting the first program data in the first latch to the second latch in response to the first suspend command; and,
transmitting the first program data in the second latch to the first latch in response to the first resume command.

13. The method of claim 12, further comprising:
restoring the second program data in the second latch by applying the first verify voltage to the first word line.

14. The method of claim 11, further comprising:
applying a third program voltage to the first word line in response to the program command before applying the first program voltage to the first word line,
wherein the third program voltage is lower than the first program voltage.

15. The method of claim 14, further comprising:
applying a fourth program voltage to the first word line in response to the first resume command after applying the second program voltage to the first word line,
wherein the fourth program voltage is greater than the second program voltage.

16. The method of claim 10, further comprising:
applying a third program voltage to the first word line in response to the program command before applying the first program voltage to the first word line,
wherein the third program voltage is lower than the first program voltage,
the second program voltage is greater than the first program voltage, and
a first difference between the first program voltage and the third program voltage is greater than a second difference between the first program voltage and the second program voltage.

17. The method of claim 16, further comprising:
applying a fourth program voltage to the first word line in response to the first resume command after applying the second program voltage to the first word line,
wherein the fourth program voltage is greater than the second program voltage, and
a third difference between the fourth program voltage and the second program voltage is greater than the second difference between the first program voltage and the second program voltage.

18. A method of programming a non-volatile memory device stacked on a substrate in a vertical direction and including a plurality of memory cells connected to a plurality of word lines and a plurality of bit lines, the method comprising:
receiving a program command;
selecting a first word line of the plurality of word lines in response to the program command;
applying a first program voltage to the first word line in response to the program command;
receiving a first suspend command;

applying a first verify voltage to the first word line in response to the first suspend command;

entering a first suspend state in response to the first suspend command;

receiving a first read command;

reading a data from a first memory cell connected to a second word line of the plurality of word lines in response to the first read command;

receiving a first resume command;

applying a second program voltage greater than the first program voltage to the first word line in response to the first resume command.

19. The method of claim 18, further comprising:

applying a third program voltage to the first word line in response to the program command before applying the first program voltage to the first word line, wherein the third program voltage is lower than the first program voltage.

20. The method of claim 19, wherein a first difference between the first program voltage and the third program voltage is equal to a second difference between the first program voltage and the second program voltage.

\* \* \* \* \*